United States Patent [19]

Ichikawa et al.

[11] Patent Number: 5,077,798
[45] Date of Patent: Dec. 31, 1991

[54] METHOD AND SYSTEM FOR VOICE CODING BASED ON VECTOR QUANTIZATION

[75] Inventors: Akira Ichikawa, Musashino; Yoshiaki Asakawa, Kawasaki; Shunichi Yajima, Hachioji; Toshiyuki Aritsuka, Higashimurayama; Katsuya Yamasaki, Fujisawa, all of Japan

[73] Assignee: Hitachi, Ltd., Tokyo, Japan

[21] Appl. No.: 412,987

[22] Filed: Sep. 26, 1989

[30] Foreign Application Priority Data

| Sep. 28, 1988 | [JP] | Japan | 63-240972 |
| Mar. 13, 1989 | [JP] | Japan | 1-057706 |
| Apr. 28, 1989 | [JP] | Japan | 1-107615 |
| Aug. 18, 1989 | [JP] | Japan | 1-211311 |

[51] Int. Cl.⁵ ............................................. G10L 5/00
[52] U.S. Cl. ............................................. 381/36
[58] Field of Search .................................. 381/29–41; 364/513.5; 375/122

[56] References Cited

U.S. PATENT DOCUMENTS

| 4,811,398 | 3/1989 | Copperi et al. | 381/40 |
| 4,860,355 | 8/1989 | Copperi | 381/36 |
| 4,975,957 | 12/1990 | Ichikawa et al. | 381/36 |

Primary Examiner—Emanuel S. Kemeny
Attorney, Agent, or Firm—Antonelli, Terry Stout & Kraus

[57] ABSTRACT

A system for voice coding based on vector quantization has an apparatus in which a distribution area of parameters representative of a voice is divided into a plurality of domains so that one vector (code vector) may correspond to one domain, an apparatus for representing individual code vectors by codes specific thereto, an apparatus for converting an input voice into a vector and determining membership functions by numerically expressing the distance between the nearest code vector and each of the predetermined number of neighboring vectors, and an apparatus for transmitting, as fuzzy vector quantization information, a code of the nearest code vector and the membership functions.

34 Claims, 18 Drawing Sheets

| VECTOR CODE | VECTOR ELEMENT VALUES | NEIGHBORING VECTOR CODES | | | |
|---|---|---|---|---|---|
| $V_1$ | $A_{11}, A_{12}, ---, A_{1m}$ | $V_{11}$ | $V_{12}$ | --- | $V_{1N}$ |
| $V_2$ | $A_{21}, A_{22}, ---, A_{2m}$ | $V_{21}$ | $V_{22}$ | --- | $V_{2N}$ |
| $V_3$ | $A_{31}, A_{32}, ---, A_{3m}$ | $V_{31}$ | $V_{32}$ | --- | $V_{3N}$ |
| ⋮ | -------- | ⋮ | ⋮ | --- | ⋮ |

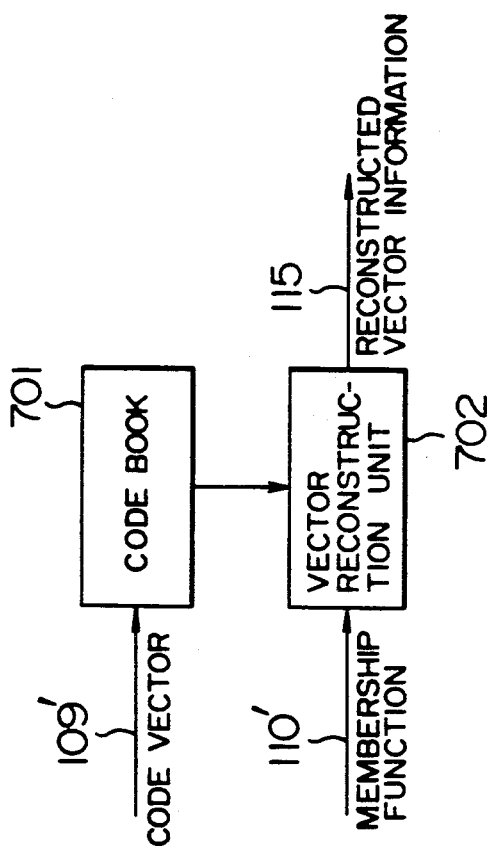
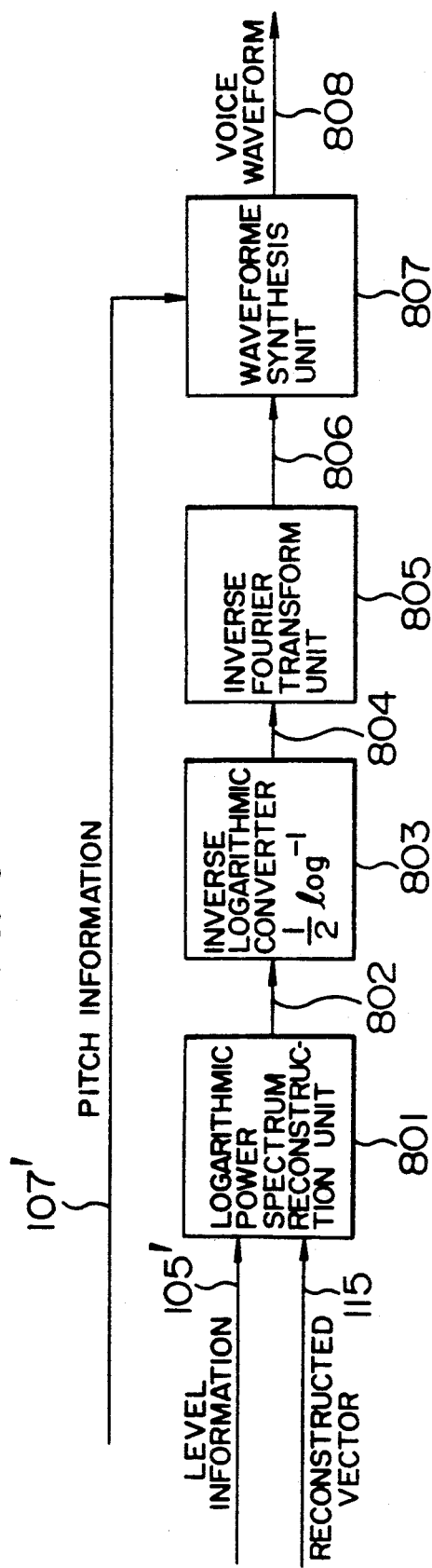

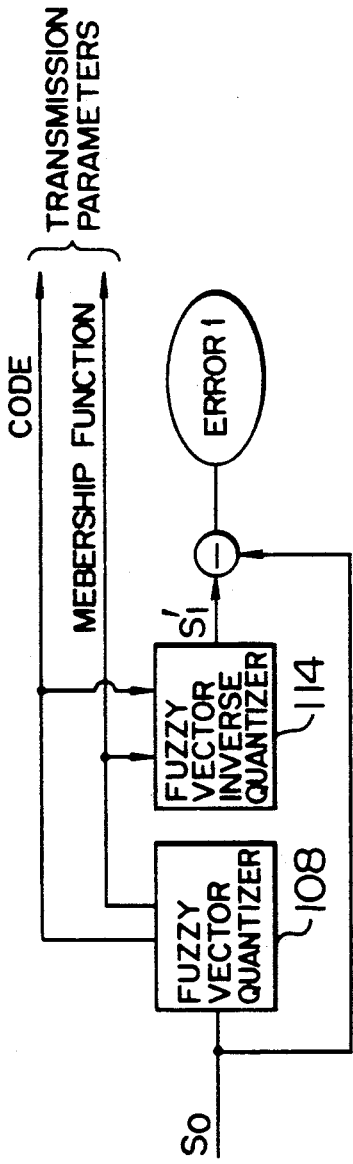
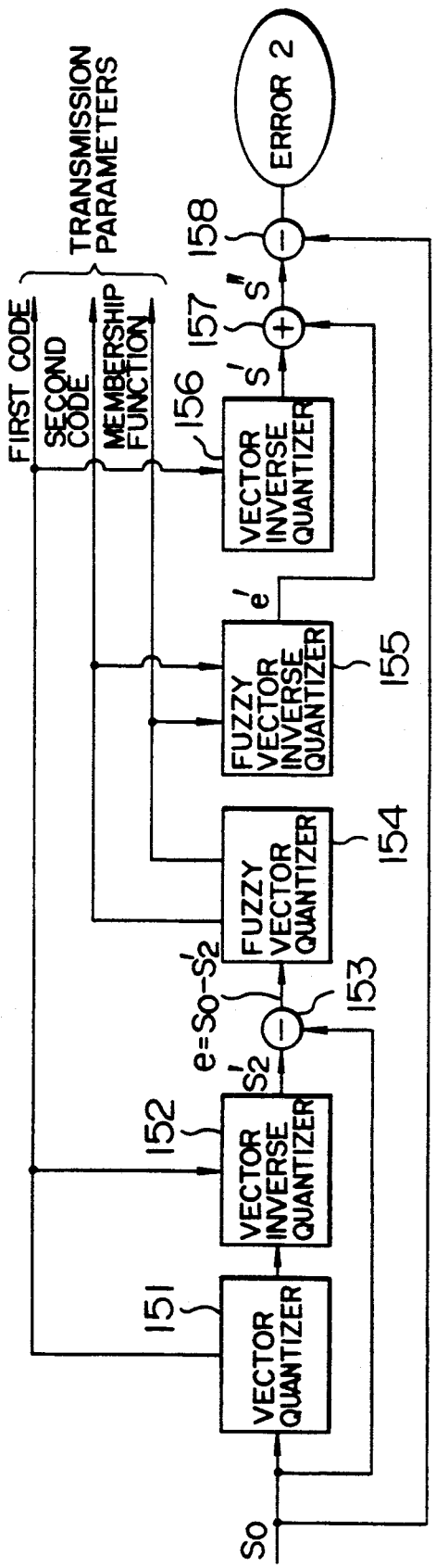

F I G. 14
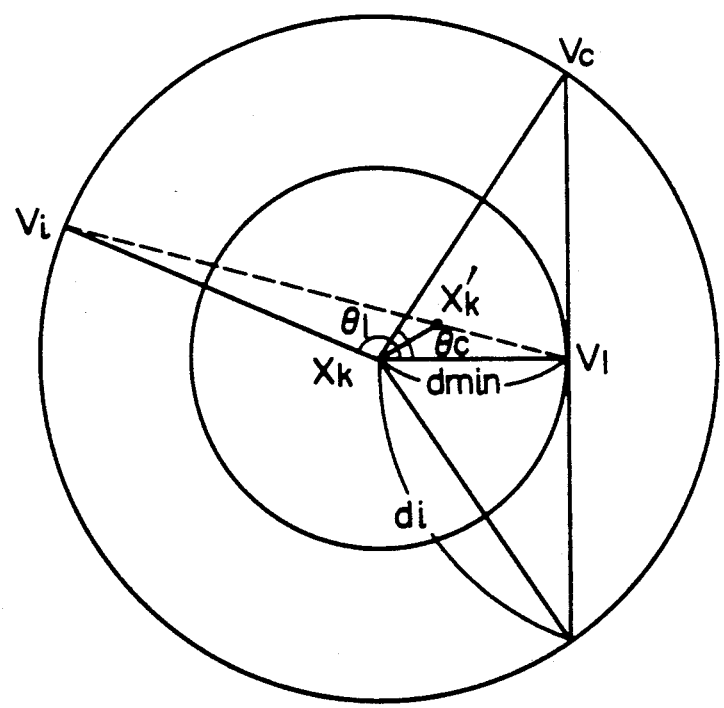

(ORDINARY FUZZY VECTOR QUANTIZATION)

(FUZZY VECTOR QUANTIZATION USING NEIGHBORING VECTORS REGISTERED IN ADVANCE)

RELATION BETWEEN CODE BOOK SIZE AND QUANTIZATION DISTORTION

METHOD AND SYSTEM FOR VOICE CODING BASED ON VECTOR QUANTIZATION

BACKGROUND OF THE INVENTION

This invention relates to a system for coding with high efficiency and more particularly to method and system for voice coding which are suitable for providing a reproduced voice of high quality at a high information compression rate.

In the past, a variety of highly efficient voice coding systems have been proposed. For example, "Digital Information Compression" by Kazuo Nakada, published by Kohsaido Sampoh Shuppan, Electronic Science Series 100 explains plainly various systems, showing many systems belonging to waveform coding system and information source coding system (parameter coding system). One may also refer to "Study of Vector Coding of Voice" by Moriya et al, Papers SP86-16 (1986) of Voice Research Conference, The Institute of Electronics and Communication Engineers of Japan, and JP-A-63-285599.

Of the above conventional systems, the waveform coding system can generally insure good voice quality but has difficulties in raising the information compression efficiency, and the parameter coding system can provide high information compression efficiencies but is disadvantageous in that even with the amount of information increased, improvements in voice quality are limited and sufficiently high quality can not be obtained. Thus, in an information compression region (near 10 kb/s) between bands which are well adapted for the above two systems, the performance particularly in terms of voice quality relative to the quantity of the information is degraded. Under the circumstances, a hybrid system utilizing advantages of the above two systems has recently been proposed, including a multi-path type (for example, B. S. Atal et al, "A new Model of LPC Excitation for Producing Natural-Sounding Speech at Low Bit Rates" Proc, ICASSP 82, PP. 614-617, (1982), a CELP type (B. S. Atal et al, "Stochastic coding of speech signals at very low bit rates" Proc. ICC 84, pp. 1610-1613 (1984)) and a TOR type (A. Ichikawa et al, "A Speech Coding method Using Thinned-out Residual" Proc, ICASSP 85, pp. 961-964 (1985)), and has been studied from various view points. But the hybrid system is still unsatisfactory from the standpoint of not only voice quality but also processing expense.

In general, various highly efficient coding systems is using the fact that voice information is locally existent within the range in which parameters are available. The above technical idea has been further developed positively. Combination of a plurality of parameters is represented with a vector. The localization of the vectors is noticed, so that the voice informations can be represented by smaller informations. Such a system, called a vector quantization system and disclosed in, for example, R. M. Gray, "Vector Quantization" IEEE ASSP Magazine, pp. 4-29, (1984, 4) has been highlighted. To describe the vector quantization system more specifically, when a voice is expressed using suitable parameters, the parameters are distributed in a special pattern because of the structure of human mouth. As an example, FIG. 1 graphically shows a voice expressed in terms of two parameters a and b. Most of human speech can be expressed by parameter values filling within an area A. In order for the voice to undergo vector quantization, the area A is divided into a great number of domains and codes 1, 2, 3, . . . specifying individual domains are allotted thereto.

In the case of scaler quantization, when the voice repreSented by a point x in FIG. 1 is coded, $a_1$ as a parameter "a" and $b_1$ as a parameter "b" are independently transmitted. On the other hand, in the case of vector quantization, code 12 is transmitted. The code 12 specifies the divided region in which the point x is included.

In the case of scalar quantization, the voice information is represented with the value from $a_{min}$ to $a_{max}$ as the parameter "a" and with the value from $b_{min}$ to $b_{max}$ as the parameter "b" in order to cover the whole area in which there is voice information. Since the parameters "a" and "b" are independently used, the information used for representing the voice is allotted to each divided region within the rectangular region represented by B in FIG. 1. As a result, the voice information is allotted to the region (B - A), even though the voice is not actually present in that region. On the other hand, in the case of vector quantization, since the information used for representing the voice is allotted only in the region represented by A in FIG. 1 in which the voice is present, the information can be compressed more than is possible with scalar quantization.

The method of decoding transmitted codes in the vector quantization is explained below. Each divided region is represented by a representing vector, each having values for each of the parameters which represent the divided region. The representing vector is called a code vector or a centroid. This system is provided with a table called a code book in which the representing vector and the corresponding code are listed. Identical code books are provided on the transmitting side (coding side) and on the receiving side (decoding side) respectively, so that the representing vector corresponding to the transmitted code can be obtained by searching the code book. However, in general, there is a difference between the vector representing the actual input voice (referred to hereinafter input vector) and the representing vector which is obtained. The difference is a quantization distortion.

In the vector quantization system, in order to realize high quality voice coding, it is necessary to prepare in advance a code book of high quality which can express a voice with as high fidelity as possible. To this end, many problems have to be solved including the necessity of use of a sufficiently large amount of speech as training data and the decision as to how many codes the code book should contain and as to what parameters should be used. As a countermeasure against problems encountered in preparation of the code book, a fuzzy vector method (for example, H. P. Tseng, et al, "Fuzzy Vector Quantization Applied to Hidden Markou Modeling" ICASSP 87', 4 (1987)) has been proposed wherein a membership function is used for determining the input voice through interpolation. The membership function represent the degree of similarity between the input vector and each of the representing vectors by using numerical values. The similarity is concretely represented by the distance between the input vector and each of the representing vectors. In the fuzzy vector method, in spite of the fact that the voice quality is expected to be improved in proportion to the quality of the code book, it is not used as technique for transmission because of a large amount of the membership function. At present, the use of the fuzzy vector method for pre-processing of speech recognition has been studied at the most. In addition, a KNN method (for example, "Study of Normalization of Spectrogram by Using Fuzzy Vector Quantization" by Nakamura et al., Papers SP87-123 of Voice Research Conference, Feb. 19, 1988) has been proposed wherein with the view of decreasing the amount of information, the input voice is compared with each of all the representing vectors registered in a code book so that only N vectors close to a point representative of the input vector may be used. The KNN method, however, requires a sorting processing for selection of the N representing vectors (code vectors) close to the input voice point and the amount of processing in the sorting processing raises a very severe problem from the practical standpoint. Further, the transmission of codes of all the N representing vectors causes loss on the amount of the information to be transmitted.

SUMMARY OF THE INVENTION

An object of the present invention is to provide a method and apparatus which can reproduce an input voice with fidelity by using a smaller amount of transmission information in voice coding based on vector quantization.

A second object of the invention is to provide a method and apparatus which are suitable for reproduction of a high-quality decoded voice and vector quantization.

According to the present invention, to accomplish the first object, first to fourth methods may be employed.

In accordance with the first method, N codes of neighboring vectors are registered in association with individual codes in the code book.

In accordance with the second method, fuzzy vector quantization is effected by selectively using representative vectors (hereinafter referred to as code vectors) in the code book in accordance with an input vector. Means for selecting the code vectors includes means for selecting candidates for the code vectors to be used, means for evaluating the relation of the candidate vectors to the input vector, and means for determining a vector to be used on the basis of results of the evaluation.

In accordance with the third method, results of the immediately preceding quantization (reconstructed vectors) are used to approximate the succeeding input vector. Since the reconstructed vector is used for quantization of the input vector, the coding station has inverse quantization means having the same function as that of inverse quantization means provided in the decoding station, storage or memory means for holding the reconstructed vector until a quantization processing of the succeeding input vector starts, and means for reading the reconstructed vector upon quantization.

In accordance with the fourth method, means is employed which approximates an input vector by using a function of a plurality of representative vectors (code vectors) in the code book. The function approximation means includes means for selecting a plurality of code vectors on the basis of a predetermined evaluation criterion, and means for calculating parameters of the function.

According to the invention, to accomplish the second object, Fourier expansion of the spectral envelope is employed. For example, used as elements of a vector are parameters called power spectrum envelope (PSE) parameters or quasi stationary spectrum (QSS) parameters. The PSE parameters are described in a paper entitled "Method of Analyzing Voice Power Spectral Envelope Based on Sampling at Intervals of Fundamental Frequency" by Nakajima et al, Papers SP 86-94 of Voice Research Conference, Denshi-jyohhoh Tsuhshin Gakkai, 1986 and the QSS parameters are described in Japanese Patent Application No. 63-166714. According to these literatures, in the coding station, a voice is subjected to Fourier transform in a predetermined relationship with a pitch period equal to a vibration period of the vocal chords, and only harmonics (line spectrum components) of the pitch frequency are extracted. The harmonics are squared to obtain a power spectrum and the envelope of the power spectrum is expanded in terms of a cosine series and coefficient values of the cosine series are used as element values (parameters) of vector. In the decoding station, element values of a vector are read out of the code book and subjected to inverse transform to obtain a cosine series value, and envelope of the spectrum is determined and subjected to Fourier inverse transform to recover waveforms which in turn are superimposed sequentially at the pitch period to reproduce a voice waveform.

Advantageously, according to the invention, the amount of the information can always be reduced as compared to that by the conventional fuzzy vector quantization and hence a high-quality voice can be transmitted using the same amount of information. Conversely, for the same quality, the amount of information can be reduced as compared to the conventional method.

BRIEF DESCRIPTION OF THE DRAWINGS

FIG. 8 is a block diagram of a fuzzy vector inverse quantizer in the FIG. 2 system.

FIG. 9 is a block diagram of a synthesizer in the FIG. 2 system and used for reconstruction of an input voice signal.

FIGS. 12A and 12B show a modification based on the first method.

FIG. 14 is a diagram useful in explaining the manner of determining a reconstructed vector.

PREFERRED EMBODIMENTS OF THE INVENTION

Figure 1:
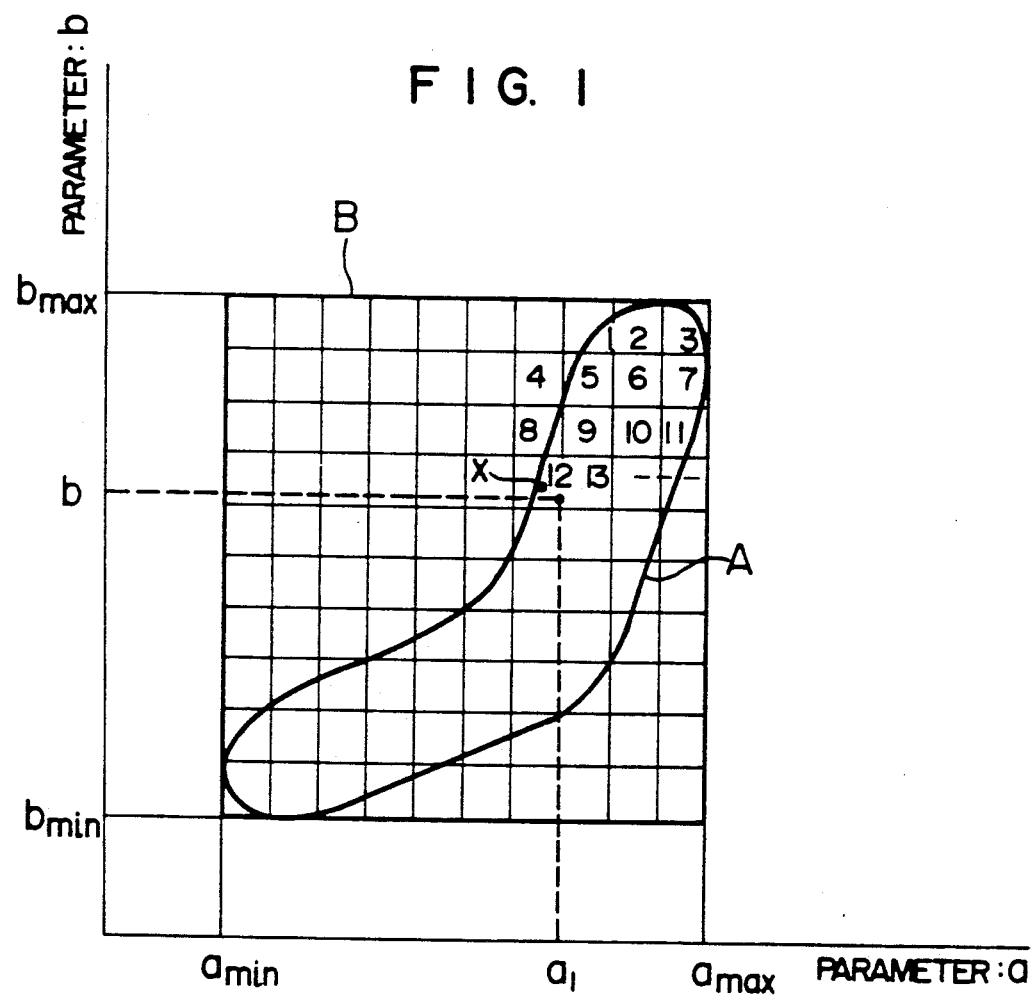
FIG. 1 is a graphic representation useful to explain the principle of vector quantization.

The first method of the present invention will be implemented as below.

When a voice desired to be transmitted is applied to the system, the voice is converted into the vector (input vector) representing the features of the voice being inputted. Then it is compared sequentially with individual code vectors in a code book and one code nearest to the input voice is selected. Since N codes neighboring the selected code are registered as neighboring codes, code vectors corresponding to the N codes and the initially selected code are taken out, membership function is determined from the distance between the input vector and each vector, and the initially selected code and N+1 membership functions are coded into a single transmission code which in turn is transmitted. In the receiving station, there is provided a code book having the same information as that of the code book in the transmitting station, and code vectors corresponding to the received code and N code vectors corresponding to the N registered codes are read out of the code book and combined with membership functions to reconstruct the voice. N code vectors are identical with the N code vectors selected in the transmitting station. As is clear from the above, since the transmission is perfected with only one transmission code, the transmitting station is not required to select N+1 codes and the amount of information necessary for transmission of N codes is unneeded, coding allotment in transmission can be eliminated to ensure highly efficient transmission.

A pitch period equal to a vibration period of the vocal chords is extracted from the input voice, and the input voice is subjected to a Fourier transform at a constant interval or a interval which has a predetermined relationship to the pitch period and thereafter converted into a power spectrum. Only information about harmonic positions of the pitch period of the power spectrum is taken out, and a series of the information is normalized so as not to be affected by the magnitude of voice and thereafter subjected to cosine expansion. Coefficients of the orders extending up to, for example, about the 20-th order are than taken out. The coefficients are obtained from cosine transform in which the series of the information is normalized by a half frequency width of a sampling frequency. Therefore, substantially the same coefficients can be obtained from a spectrum of a voice of a different pitch period which is uttered from the same vocal tract. Accordingly, by using the coefficients as elements of vector, the inter-vector distance can be made to be smaller for voices having similar spectral envelopes and the vector quantization can be done very conveniently. In the cosine expansion, components of lower order of vector indicate global characteristics of spectrum and components of higher order provide information indicative of fine characteristics of spectrum and therefore the code book can be prepared systematically to permit the speed of reconstruction to be increased very conveniently by using tree coding technique. For transmission, level information for recovering the vector information, pitch period information and voice magnitude may be used.

Figure 2:
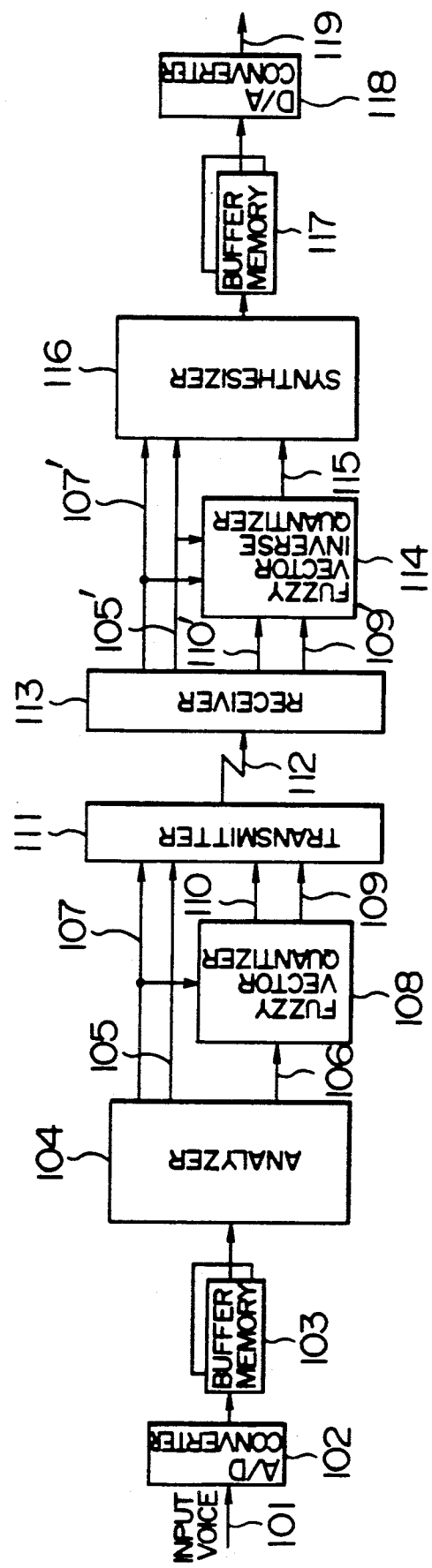
FIG. 2 is a block diagram illustrating the construction of a system according to the invention.

An embodiment of the first method according to the invention will now be described by making reference to the accompanying drawings. FIG. 2 is a block diagram useful to explain the embodiment and in this block diagram, only unidirectional flow of signals throughout transmitting and receiving stations is illustrated with omission of communication lines in the inverse direction for avoidance of prolixity of illustration.

Referring to FIG. 2, an input voice 101 is applied to a buffer memory 103 of a bifacial structure via an analog/digital (A/D) converter 102. The memory 103 is adapted to adjust timings for the succeeding processings and to prevent interruption of the input voice. An analyzer 104 extracts, from the voice sent from the buffer memory 103, pitch information 107, spectrum information 106 and level information 105. In this embodiment, spectrum information 106 obtained in the analyzer 104 is represented by vector. A fuzzy vector quantizer 108, one of features of the present invention, receives the spectrum information 106 to produce a nearest vector code 109 and a membership function 110 indicative of the similarity between input vector and code vector. The vector code 109, membership function 110, pitch information 107 and level information 105 are sent to a receiver 113 via transmitter 111 and transmission line 112. In the receiving station, the receiver delivers a vector code 109', a membership function 110', pitch information 107' and level information 105' to a fuzzy vector inverse quantizer 114. The inverse quantizer 114 reconstructs spectrum information which is fed, along with the pitch information 107' and vector information 105', to a synthesizer 116. A voice waveform reconstructed at the synthesizer 116 is fed via an output bifacial buffer memory 117 to a D/A converter 118 from which an output voice 119 is reproduced.

Figure 3:
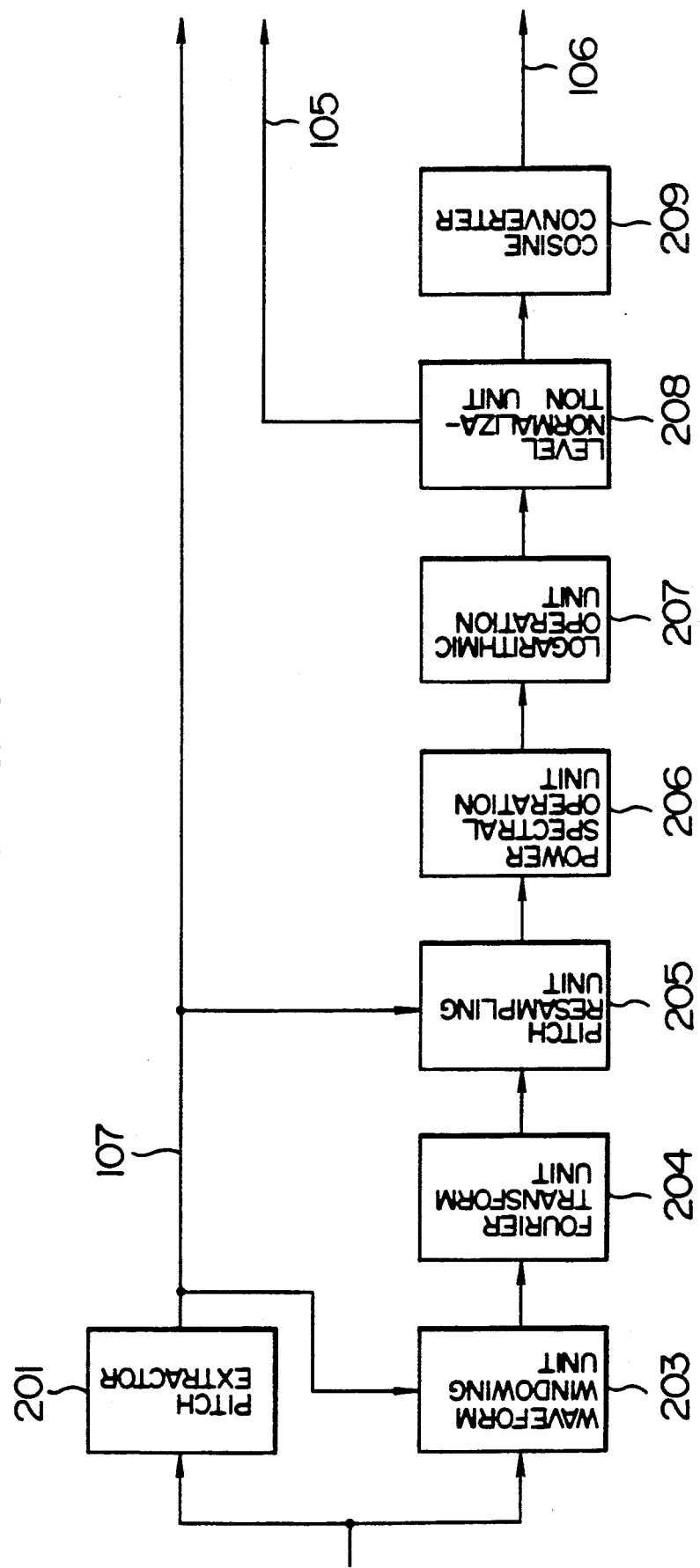
FIG. 3 is a block diagram of an analyzer in the FIG. 2 system.
Figure 4:
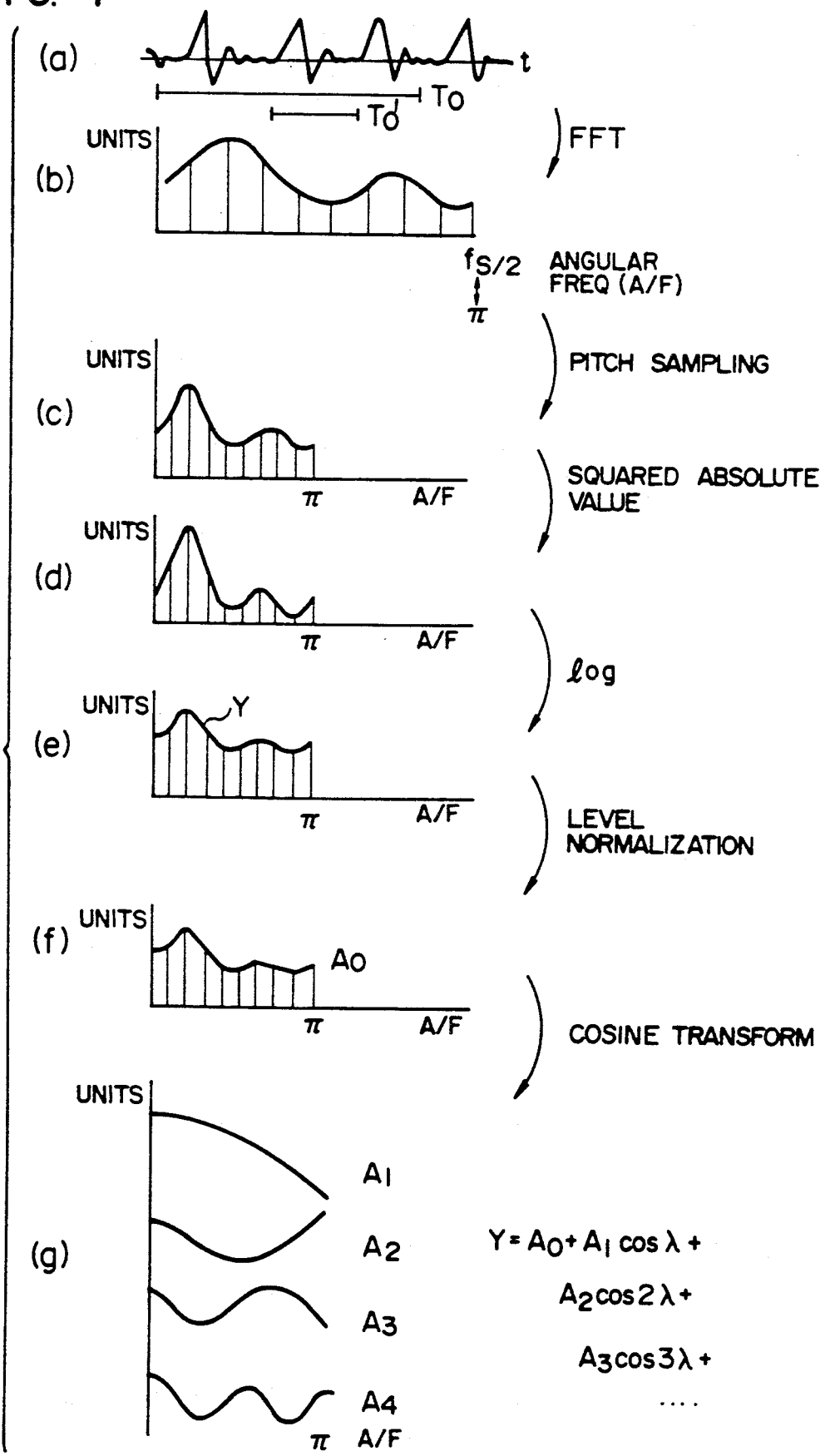
FIGS. 4a–g are diagrams for explaining the operation of the analyzer.

To detail the blocks of FIG. 2, reference should first be made to FIGS. 3 and 4 which are useful to explain the analyzer 104.

In this embodiment, the analyzer is based on the power spectral envelope (PSE) analysis method. The PSE analysis method is detailed in a article entitled "Voice Analysis and Synthesis System Based on Power Spectral Envelope (PSE)" by Nakajima et al, Transactions of Acoustical Society of Japan, Vol. 44, No. 11 (1988, 11) and will be outlined herein.

Referring to FIG. 3, a pitch extractor 201 extracts pitch information from the input voice. A variety of methods for extraction of pitch information which are known and used widely may be applicable to the present invention and will not be described herein. A waveform windowing unit 203 is adapted to window a waveform interval of the input voice which is necessary for analysis of the spectrum information and in the socalled PSE method, a waveform portion of an interval $T_0$ containing about three pitch periods is windowed as shown (a) in FIG. 4a. However, in the guasi stationary spectrum (QSS) method, an interval equalling one pitch period $T'_0$ may be windowed. Windowing can be done easily by detecting maximum values of waveform while consulting the pitch information. The windowed waveform portion is sent to a Fourier transform unit 204 and transformed into a Fourier series. In the PSE method, it is efficient to use a fast Fourier transform (FFT)

wherein a commonly used window function such as hamming window or Gauss window is applied and then as many as approximately 2048 points are used which are obtained by filling zero data forwardly and backwardly of the window. In the QSS method, however, the application of the window function is not effected and the number of points may be as small as about 512 because, as will be described later, sampling of harmonics of the pitch frequency is not effected and hence transform using so many pieces of data as amounting to 2048 points is not always required. As a result of the FFT, a Fourier series as shown in FIG. 4b is obtained. The resulting Fourier series is of a line spectrum structure corresponding to harmonics of the pitch frequency in the PSE method, but in the QSS method no line exists and the resulting Fourier series is a continuous spectrum.

A pitch re-sampling unit 205 is needed for the PSE method but unneeded for the QSS method. The pitch re-sampling unit 205 extracts only a harmonic component (line spectrum component) of the pitch frequency as shown in FIG. 4c from the spectrum information as shown in FIG. 4b resulting from the FFT. For simplicity of consideration under varying frequency, in the PSE method, the extracted data shown in FIG. 4c is normalized with respect to unit $\pi$ of the period of the cosine expansion to be described later and in the QSS method, the half fs/2 of sampling frequency of the original spectrum shown in FIG. 4b is normalized with respect to angular frequency $\pi$.

To ensure evaluation in terms of energy, a power spectral operation unit 206 squares each component of the spectrum and converts it into a power spectrum as shown in FIG. 4d. A logarithmic operation unit 207 applies logarithmic operation to each component to provide a logarithmic power spectrum as shown in FIG. 4e. Obviously, the above two operations can be unified to obtain a value equal to a doubled logarithm of absolute value. A level normalization unit 208 is operative to absorb level variations in the input voice so as to provide a signal which does not depend on the level of the input voice. In an alternative, the level normalization may be unified into the sixth-order term of cosine expansion and may be delivered as 0-order term output from a cosine converter 209 to be described below. The cosine converter 209 produces coefficients of cosine expansion of the envelope of the logarithmically operated power spectrum which are indicated in $$Y = A_0 A_1 \cos\lambda + A_2 \cos 2\lambda + A_3 \cos 3\lambda + \ldots \quad (1)$$

where Y represents the envelope. Since the cosine function is an orthogonal function, A can be obtained through multiplication of the envelope Y and cos(nX). Thus, $A_0$ is delivered as level information 105, and $A_1$, ---, $A_m$ are delivered as spectrum information 106.

In a voice having a low pitch frequency, the number of pitch harmonics which fall within a predetermined band is large and the number of pieces of effective information increases correspondingly, thereby ensuring that the available value of the order m of spectrum information can be extended to a high value. Therefore, by making the value of m variable depending on the pitch and preparing a code book containing vectors of different orders which stand for spectral parameters, the information can be utilized efficiently.

Figure 5:
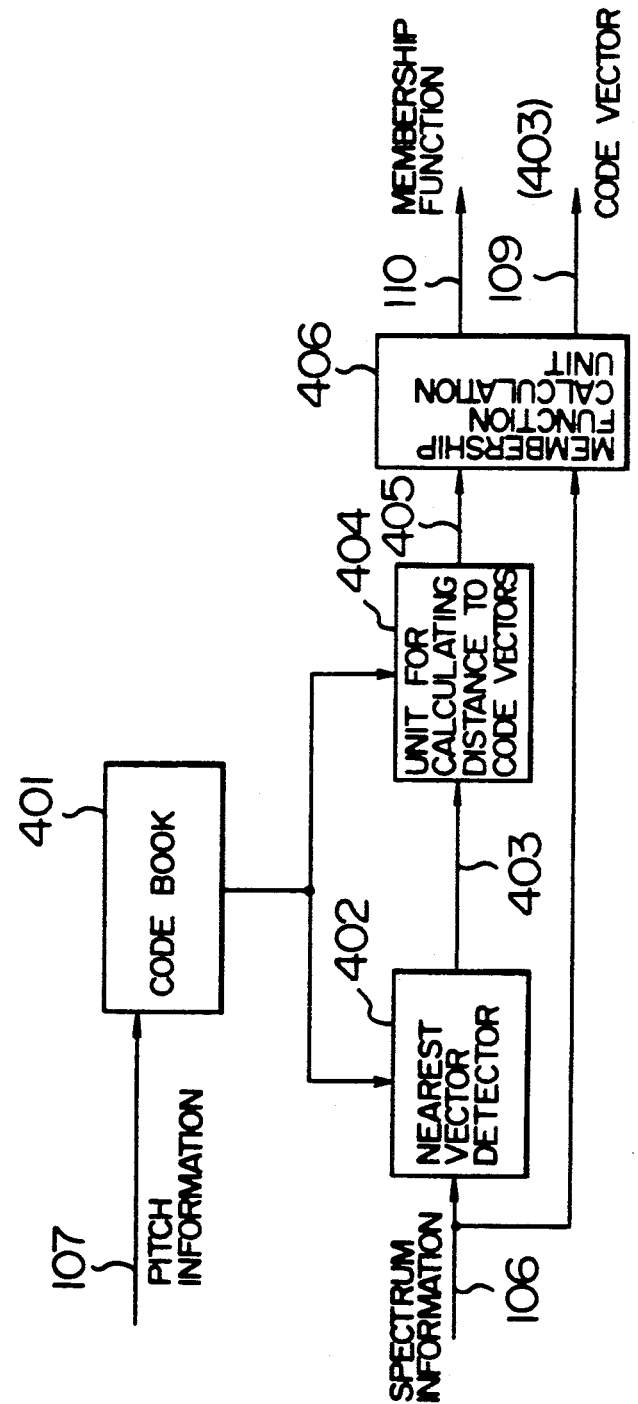
FIG. 5 is a block diagram of a fuzzy vector quantizer in the FIG. 2 system and based on the first method of the invention.
Figures 6, 7:
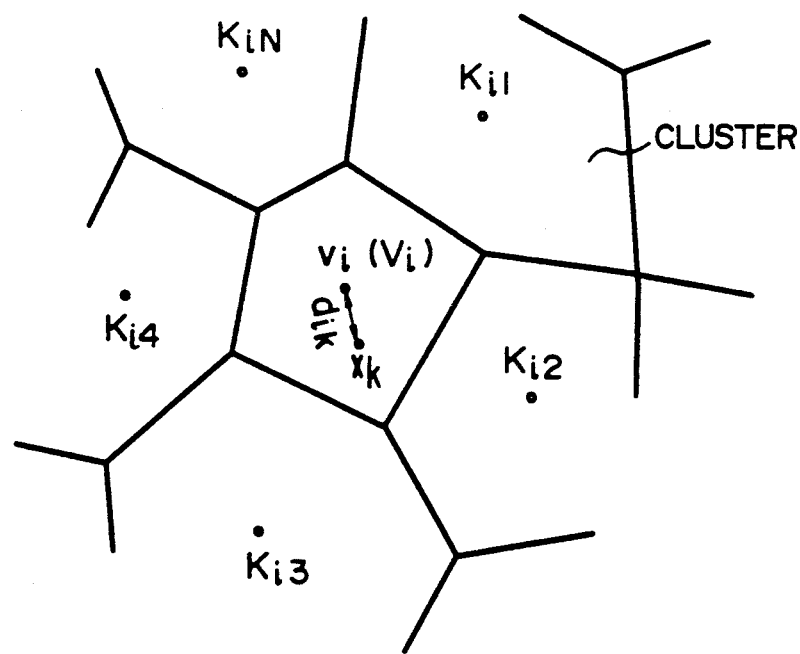
FIGS. 6 and 7 are diagrams useful to explain the operation of the FIG. 5 fuzzy vector quantitizer.

Turning to FIGS. 5, 6 and 7, the fuzzy vector quantizer will be described. The quantizer constructed as shown in FIG. 5 includes a code book 401 for recording data as shown in FIG. 6. To minimize the speed of retrieving the code book, the search range of individual pieces of spectrum information may be limited. Also, the pitch information may be utilized to determine the upper limit of the order of spectrum information and distance calculation to be described below may be carried out under the condition of the thus determined upper limit. The construction of the code book 401 is explained below. In the code book, a code Vi allotted to the code vector vi and the corresponding elements $\{A_{i1}, A_{i2}, ---, A_{im}\}$ of the code vector $v_i$ are listed. In the present invention, codes $V_{i1}$, $V_{i2}$, ---$V_{iN}$ corresponding to neighboring vectors $k_{i1}$, $k_{i2}$, ---, $k_{iN}$ of the code vector $v_i$ are also listed as shown in FIG. 6. A nearest vector detector 402 calculates a distance dik between a input vector xk (k represents an order of the input vector which is inputted). It is independent of the neighboring vectors ($k_{i1}$, $k_{i2}$, ---, $k_{iN}$) and each code vector $v_i$ recorded on the code book 401 and selects a nearest vector code 403 which is particularly called Vi 403 herein. With the vector code Vi 403 determined, neighboring vectors $K_{i1}$, ---, $K_{iN}$ corresponding to the codes $V_{i1}$, $V_{i2}$, ---, $V_{iN}$ are determined, because the codes $V_{i1}$, $V_{i2}$, ---, $V_{iN}$ are resistered in the code book as shown in FIG. 6. N measures 5 to 6. The vector information xk, code vector vi and neighboring vectors $K_{i1}$, ---, $K_{iN}$ are diagrammatically illustrated in FIG. 7. The input vector xk lies within a domain of the code vector vi and domains of the neighboring vectors $K_{i1}$, ---, $K_{iN}$ surround the code vector domain. In the example of FIG. 7, a vector nearest to the input vector xk is the code vector vi.

In fuzzy vector quantization, the input vector is expressed by the similarity between the input vector and each of a plurality of code vectors, and the degree of similarity is expressed in numerical form by using a membership function. The membership function is relatively determined from the distance between the input vector and each of code vectors. The fuzzy vector quantization is detailed in a literature entitled "Normalization of Spectrogram Using Fuzzy Vector Quantization" by Nakamura et al, Transactions of Acoustical Society of Japan, Vol. 45, No. 2, 1989 and in a literature quoted therein. The case of fuzzy vector quantization of the input vector xk by using the nearest code vector vi and the neighboring code vectors $K_{i1}$, $K_{i2}$, ---, $K_{iN}$ of the vector vi is explained below. The nearest vector vi is represented as $K_{i0}$ in order to bring a uniformity in the code. Given that the input vector xk is distant from the code vector vi and from each of the code vectors kil (l=0, 1, 2, ---, N) by dlk then, the distance $$dlk = \|xk - Kil\| \ldots \quad (2)$$

, where symbol " $\| \, \|$ " represents weighted Euclid distance and l=0, 1, ---, N is calculated at a unit 404 for calculating the distance from code vectors. The thus calculated distance dlk (405) is sent to a membership function calculation unit 406.

When the input vector does not coincide with any code vectors, membership functions μlk for individual code vectors are given by $$\mu lk = \cfrac{1}{\sum\limits_{j=0}^{N}\left(\cfrac{dlk}{djk}\right)^{\frac{1}{a-1}}} \quad (3)$$

where l=0, 1, ---, N, N+1 represents the number of code vectors and o represents weight coefficient which can measure $1-\infty$ and which preferably measures about 1.5 for better voice quality.

If the code vector coincides with any one of the code vectors, the membership function for the coincident code vector has a value of 1 (one) and membership functions for the remaining code vectors are rendered 0 (zero). In other words, for dlk=0, $\mu lk=1$.

In this manner, N+1 membership functions $\mu lk$ and code Vi 403 of the code vector vi are delivered as signals 110 and 109, respectively.

Processings in the receiving station will now be described.

FIG. 8 is a diagram for explaining the fuzzy vector inverse quantizer 114 as shown in FIG. 2. When the inverse quantizer 114 receives a code 109' of the code vector. The code vector vi 403 equal to $K_{10}$ and the neighboring vectors $K_{i1}$, ---, $K_{iN}$ are taken out of a code book 701 which is identical with the code book 401 in the transmitting side, and sent to a vector reconstruction unit 702. The vector reconstruction unit 702 also receives membership functions $\mu lk$ 110' and it uses the vectors $K_{i1}$, ---, $K_{iN}$ and membership functions $\mu lk$ 110' to produce a reconstructed vector x'k of the input voice signal which is $$x'k = \sum_{j=0}^{N}[(\mu_{jk})^a K_{ij}] / \sum_{j=0}^{N}(\mu_{jk})^a. \quad (4)$$

An error (distance) between input vector xk and reconstructed vector x'k is generated as quantization distortion due to fuzzy vector quantization. The reconstructed vector xk'={$A_1'$, $A_2'$..., $A_m'$} is sent as reconstructed vector information 115 to the synthesizer 116 as shown in FIG. 2.

Figure 10:
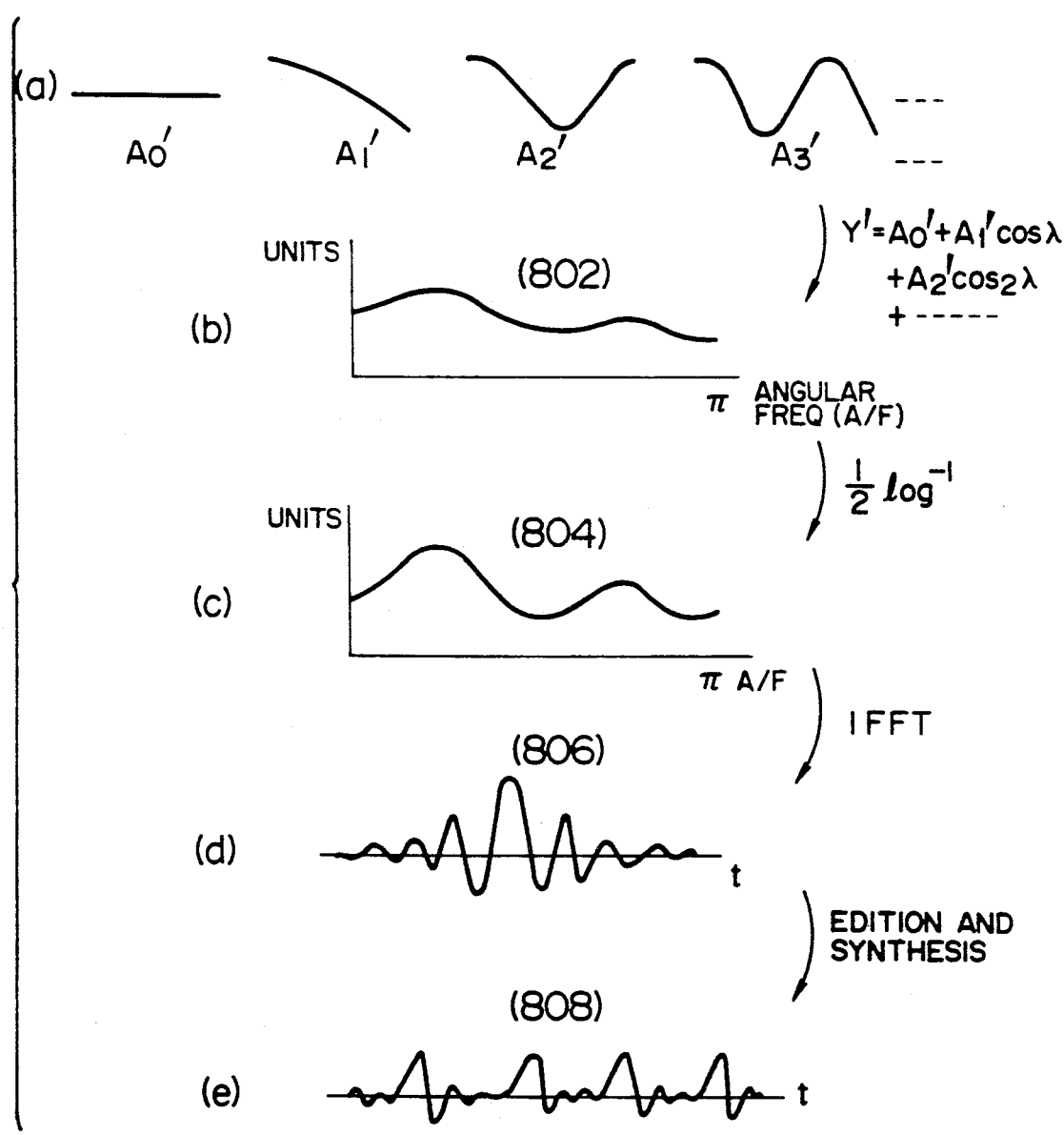
FIGS. 10a–e are diagrams for explaining the operation of the synthesizer.

The synthesizer 116 will now be described in greater detail with reference to FIGS. 9 and 10. In FIG. 9, a logarithmic power spectrum reconstruction unit 801 uses the transmitted level information $A_0'$ 105' and elements $A_1'$, $A_2'$, ---, $A_m'$ of the reconstructed vector information 115 to produce a logarithmic power spectrum envelope Y' 802 which is $$Y' = A_0' + A_1'\cos\lambda + A_2'\cos 2\lambda + \ldots + A_m'\cos m\lambda \ldots \quad (5)$$

wherein
Thus, the element values as shown in FIG. 10a are synthesized pursuant to equation (5) to provide a logarithmic power spectrum as shown in FIG. 10b.

At an inverse logarithmic converter 803, the reconstructed logarithmic power spectrum Y' envelope 802 is subjected to $(\frac{1}{2})\log^{-1}$ conversion and amplitude spectrum envelope 804 represented with linear scale is obtained from the converter 803 as shown in FIG. 10c. The spectrum 804 is sent to an inverse Fourier transform unit 805. The spectrum 804 undergoes inverse fast Fourier transform (IFFT) at the inverse Fourier transform unit 805 to produce a voice signal 806 as shown in FIG. 10d. The voice signal 806 is obtained as a symmetric impulse response under the condition of zero-phasing operation so as not to generate a distortion on the waveform in a following waveform synthesizing stage.

At a waveform synthesis unit 807, the voice signal 806 is sequentially shifted by the pitch interval in accordance with the pitch information 107' so as to be added together and the thus synthesized signal is delivered out of the unit 807, as shown in FIG. 10e, as voice waveform 808. For edition and synthesis of voice signal at the pitch period, a widely known method may be used and will not be detailed herein. The processings in the receiving station do not differ for the PSE method and the QSS method.

By introducing a fixed interval of about 10 milliseconds to 20 milliseconds between fundamental processings in the transmitting and receiving stations, the signal during the fixed interval may be interpolated with estimation spectrum information $A_0'$, $A_1'$, ---, $A_N'$ for estimation during reconstruction, thereby ensuring compression of the amount of information.

In order to further improve accuracy of transmission, a fuzzy vector inverse quantizer may be provided in the transmitting station to perform a processing corresponding to equation (4), the difference between input vector xk and reconstructed vector x'k may then be evaluated and thereafter membership function values may slightly be modified sequentially to reduce the transmission error, beginning with a membership function having a large value, in consideration of the fact that the membership function for a small distance between input voice vector and code vector has a large value.

Obviously, the fuzzy vector quantization may be omitted and only vector quantization may be applied to the PSE method or the QSS method. This modification may be practiced easily by removing the component associated with fuzzy vector quantization from the construction of FIG. 2.

One problem of the vector quantization is that the amount of processings necessary for determining the distance between each vector on the code book and the input vector increases. In accordance with the invention, the amount of processings can be decreased greatly by taking advantage of characteristics of the spectrum information. More particularly, pieces of spectrum information $A_1$, ---, $A_m$ sequentially reflect characteristics of spectra, beginning with global characteristics and extending to fine characteristics, and a vector and a vector similar thereto have similarity in spectrum information of lower order. Accordingly, if code vector of spectrum information of lower order having similarity are grouped on the code book and pieces of spectrum information of higher order are sequentially taken out of the code book in accordance with a hierarchy, vectors of lower order can first be checked sequentially for their distances from the input vector and then only resembling vectors can be examined in terms of spectrum information of higher order, thereby ensuring that resembling codes can be detected without being compared with all of the codes. Further, evaluation can be done depending on the order by, for example, weighting more heavily lower orders which greatly affect voice quality.

Obviously, the coding method described herein may be used for not only transmission but also storage of, for example, voice mail, and the analyzer may be used as an independent analyzer dedicated to voice recognition and the synthesizer as an independent voice synthesizer.

Figure 11:
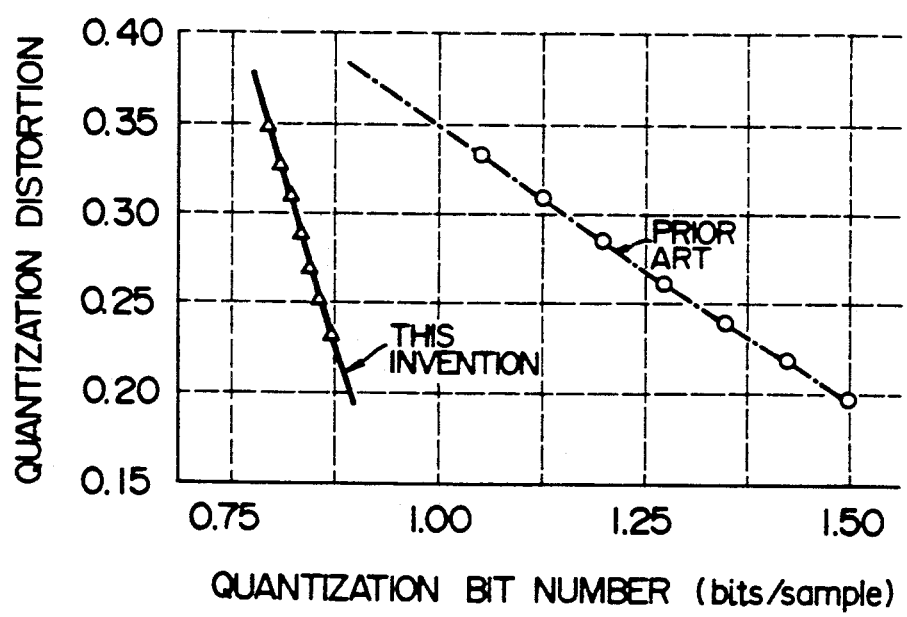
FIG. 11 is a graph showing the effect of the first method of the invention.

Meritorious effect of the first method according to the invention is graphically shown in FIG. 11, demonstrating that for the same quantization distortion, the number of transmission bits can be reduced greatly as compared to the prior art method.

Referring now to FIGS. 12A and 12B, a modification based on the first method of the invention will be described wherein in parallel with the quantization based on the first method, the quantization distortion is further quantized in accordance with the first method.

In one circuit shown in FIG. 12A, quantization based on the first method is effected at the fuzzy vector quantizer 108 and results of the quantization are delivered as code and membership function. Then, a fuzzy vector inverse quantizer 114 produces a reconstructed vector $S_1'$ of the input voice vector S0 and the quantization distortion is obtained as error 1.

In the other circuit shown in FIG. 12B, two kinds of code books are employed. An ordinary vector quantizer 151 uses a first code book in order to perform vector quantization on the basis of neighboring vectors of an input voice vector S and a resulting code is delivered as first code. Then, a vector inverse quantizer 152 produces a reconstructed vector S' and a subractor 153 produces a quantization error of $e = S_1 - S_2'$. A fuzzy vector quantizer 154 responsive to the quantization error e uses a second code book to perform fuzzy vector quantization based on the first method and the resulting second code and membership function are delivered out of the quantizer 154. A fuzzy vector inverse quantizer 155 produces a reconstructed vector e' of the quantization distortion e. A vector inverse quantizer 156 also operates to produce a reconstructed vector S' from the first code and the reconstructed vector S' is added with the reconstructed vector e' at an adder 157 to produce a new approximation vector S'' of the input voice vector S. The difference between S'' and S0 is calculated at a subractor 158 and delivered therefrom as error 2. Thus, in this modification, the errors 1 and 2 are compared and a quantization method is selected which can provide smaller one of the errors 1 and 2. In the receiving station, there is provided means for performing inverse quantization on the basis of the first and second codes and membership function. The vector quantizers 151, 152, 108 and 114 in this modification may be realized by using vector quantization means based on the first to fourth methods of the invention in combination.

The second method of the invention will now be described.

According to the second method, fuzzy vector quantization is effected by selectively using code vectors in a code book in accordance with an input vector and the second method is implemented as follows.

When receiving a voice which is desired to be transmitted, an analyzer extracts a characteristic vector from the voice. The characteristic vector is sequentially compared with code vectors in the code book and a code vector by which the quantization distortion can be minimized is selected. In case where the invention is applied to the conventional fuzzy vector quantization, a predetermined number of code vectors which are close to the input vector in an orderly manner are exemplarily selected as candidate vectors. In case where the first method by which vectors neighboring individual code vectors are registered in advance is applied, the neighboring vectors are graded in accordance with closeness to the input vector and used as candidate vectors.

An embodiment of the second method is implemented with the same system construction as that illustrated in FIG. 2.

Figure 13:
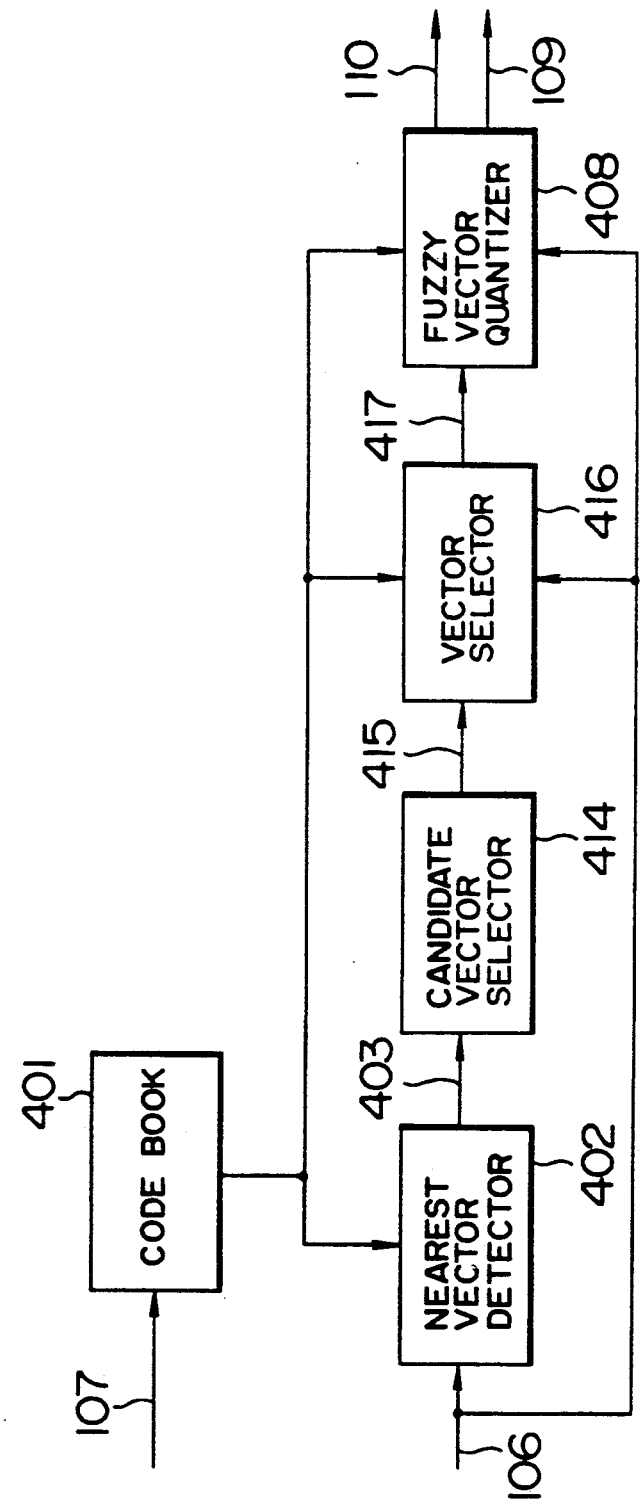
FIG. 13 is a block diagram of a fuzzy vector quantizer based on the second method of the invention.

In particular, a fuzzy vector quantizer having vector selection function is used in this embodiment and it is illustrated in FIG. 13. Referring to FIG. 13, values of elements of code vectors and their codes are stored in a code book 401.

When the input vector 106 is applied to a nearest vector detector 402, individual code vectors are read out of the code book 401 and the distance between each code vector and the input vector 106 is calculated at the detector 402 and delivered therefrom as distance value 403. The scale of the distance is set up in terms of Euclid distance in which elements of vector are weighted but obviously other suitable type of scale may also be used. In addition, the range of code vectors subjected to distance calculation may be limited by using, for example, the pitch information 107.

A candidate vector selector 414 selects candidates of code vectors for vector evaluation to be described below. The vector selector 414 looks up the distance values 403 to select a predetermined number (c) of vectors having smaller distances and delivers codes 415 of candidate vectors which are aligned orderly in accordance with closeness to the input vector. Alternatively, candidate vectors may be selected in accordance with other selection criterion than the above which prescribes a predetermined uppermost threshold of distance value for selection or both a predetermined uppermost number and a predetermined uppermost threshold of distance value for selection. If all of the code vectors in the code book are subjected to distance calculation, the candidate vector selector is not required.

A vector selector 416 calculates and evaluates quantization distortions in respect of the candidate vectors in accordance with the following procedure.

Since the minimum value dmin of the value 403 of distance from the input vector equals the quantization distortion resulting from the vector quantization of the input vector using the nearest vector (so-called ordinary vector quantization), the minimum value is first used as criterion of evaluation. Subsequently, candidate vectors other than the nearest vector and combined with the nearest vector one by one to perform fuzzy vector quantization and calculate quantization distortions. When the minimum value of the quantization distortions is below dmin, a candidate vector having that minimum value is selected. Thus, the minimum value is updated to the last mentioned minimum value which is also designated by dmin. Subsequently, in addition to the nearest vector and the vector selected as above, the remaining candidate vectors are subjected to the above procedure sequentially one by one and added until the number of the remaining candidate is zeroed. The above procedure is effective for an application where candidate vectors having minimized quantization distortions are all selected. In an alternative, the procedure may be stopped when the number of selected vectors reaches a predetermined value.

A simplified method of selecting the code vectors may be employed wherein vectors are added orderly in accordance with the closeness to the input vector and if quantization distortion after the addition is smaller than that before the addition, a vector now added is selected.

In this embodiment, the quantization distortion is used as evaluation criterion. Alternatively, when the inverse quantizer is provided in the transmitting station as in the modification based on the first method, a vector can be selected which minimizes the quantization distortion by using the difference between input vector and reconstructed vector as evaluation criterion. In another alternative, vector selection may be carried out by taking advantage of the positional relation in the vector space FIG. 14 is for explaihing the concept of this alternative. for simplicity of explanation, it is assumed that vectors are two-dimensional vectors. In FIG. 14, xk represents an input vector and vl the nearest vector. Given that a vector vi is to be evaluated, a reconstructed vector xk' resulting from fuzzy vector quantization using vl and vi lies on a straight line connecting vl and vi. Accordingly, the condition for the distance between xk' and xk being smaller than that between vl and xk is that vi is closer to xk than to a tangent at vl on a circle centered at xk and having a radius of dmin. In other words, when the distance between xk and vl and that between xk and vi are known, a vector minimizing quantization distortion can be decided by using the magnitude of angles of the three vectors vl, xk and vi.

Specifically, the reconstructed vector xk' is determined through interpolation using the vectors vi and vl which satisfy $\theta_c < \theta_1$ in FIG. 14.

A fuzzy vector quantizer 408 shown in FIG. 13 looks up a vector code 417 delivered out of the vector selector 416 and uses the selected vector to perform fuzzy vector quantization of the input vector. More specifically, membership functions are calculated pursuant to equation (3) described previously. The quantizer 408 delivers selected vector code 109 and membership functions 110. If the number of vectors to be selected is variable, information about the number of vectors is delivered. Since the sum of membership function values is 1 (one) by nature and the last membership function value is known from (1 − the sum of previously delivered values), delivery of membership functions which are smaller in number b one than the vectors suffices. If the number of actually selected vectors does not reach a predetermined (fixed) value, values of membership functions for the residual number of vectors can be zero.

When the second method is applied to the first method, the candidate vectors are the nearest vector and vectors neighboring the nearest vector and registered in advance.

In this case, the function of the candidate vector selector 414 is simplified considerably. Also, the vector code delivered out of the final stage of fuzzy vector quantizer 408 is the nearest vector code alone. Nonselected ones of the candidate vectors can be identified by making associated membership function values zero. The receiver is the same for the fist and second methods.

Figure 15:
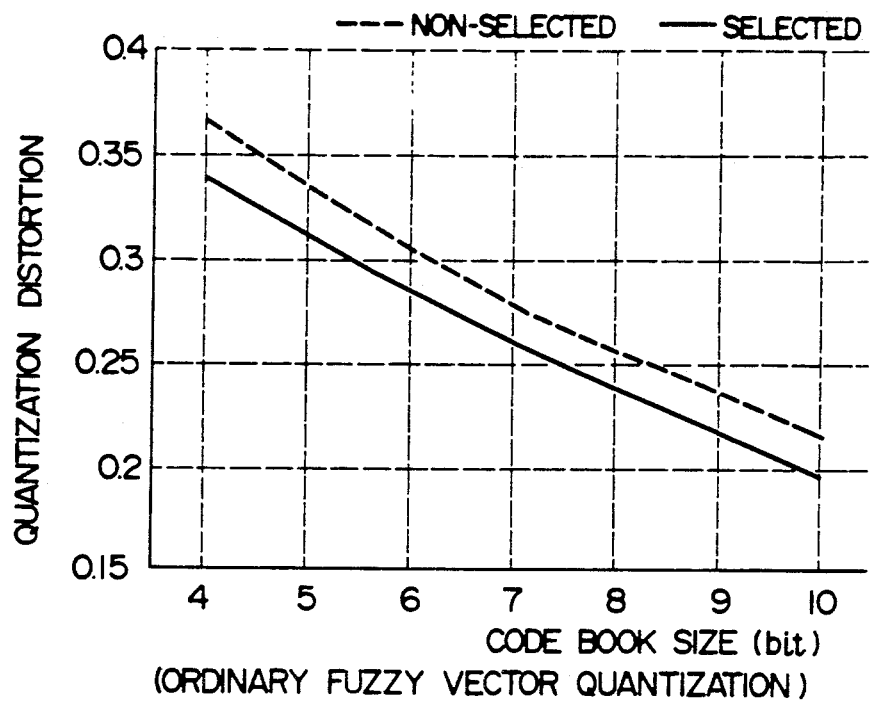
FIGS. 15 and 16 are graphs for explaining the effect of the second method of the invention.
Figure 16:
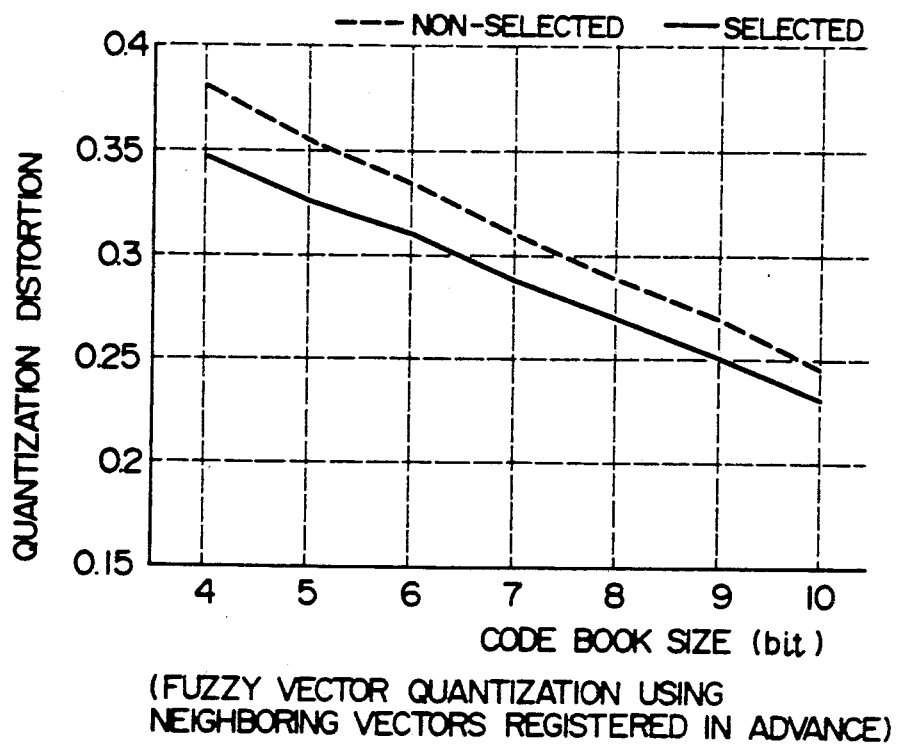

Meritorious effects of this embodiment are graphically illustrated in FIGS. 15 and 16. In these figures, the quantization distortion is plotted relative to the size of the code book for the case where the vector selection function of the invention is applied and the case where the vector selection function is not applied. In particular, FIG. 15 shows an example where the vector selection function is applied to the ordinary fuzzy vector quantization and FIG. 16 shows an example where the vector selection function is applied to the fuzzy vector quantization based on the first method in which the code book is registered in advance with neighboring vectors.

Comparison at the same code book size clearly shows that the quantization distortion is suppressed in the present embodiment.

The third method of the invention will now be described. In the third method, the nature that characteristics of the voice signal change with time relatively gradually is utilized and by using results of the immediately preceding quantization (reconstructed vector), quantization of the succeeding input vector is effected.

The third method is implemented as follows. When a voice desired to be transmitted is received, the voice is divided into frames at predetermined intervals and a characteristic vector is extracted from each frame at the analyzer. The characteristic code (input vector) is compared with code vectors in the code book. Then, a predetermined number of code vectors which are graded in accordance with the closeness to the input coded are selected. For the first method wherein neighboring vectors are registered in advance for individual code vectors, the registered neighboring vectors are read out. At the same time, a reconstructed vector resulting from inverse quantization of an input vector which has undergone vector quantization in the preceding frame is read out.

Quantization distortion and the like of code vectors read out of the code book and reconstructed vectors are evaluated in accordance with a predetermined evaluation criterion to select vectors to be used. By using codes of these vectors and membership functions representative of the degree of similarity between the input vector and each code of these vectors, the input vector is quantized. The codes and membership functions are transmitted to the receiving station and at the same time applied to the inverse quantizer in the transmitting station at which inverse quantization is effected using the code vector and reconstructed vector used for quantization of the input vector to produce a reconstructed vector which in turn is stored in a reconstructed vector memory to be described later.

As is clear from the foregoing, the use of the reconstructed vector in the preceding frame for the fuzzy vector quantization attains the same effect as that attained by the addition of a code vector having high similarity to the input vector and therefore the vector quantization with reduced quantization distortion can be accomplished without increasing the amount of information,.

Figure 17:
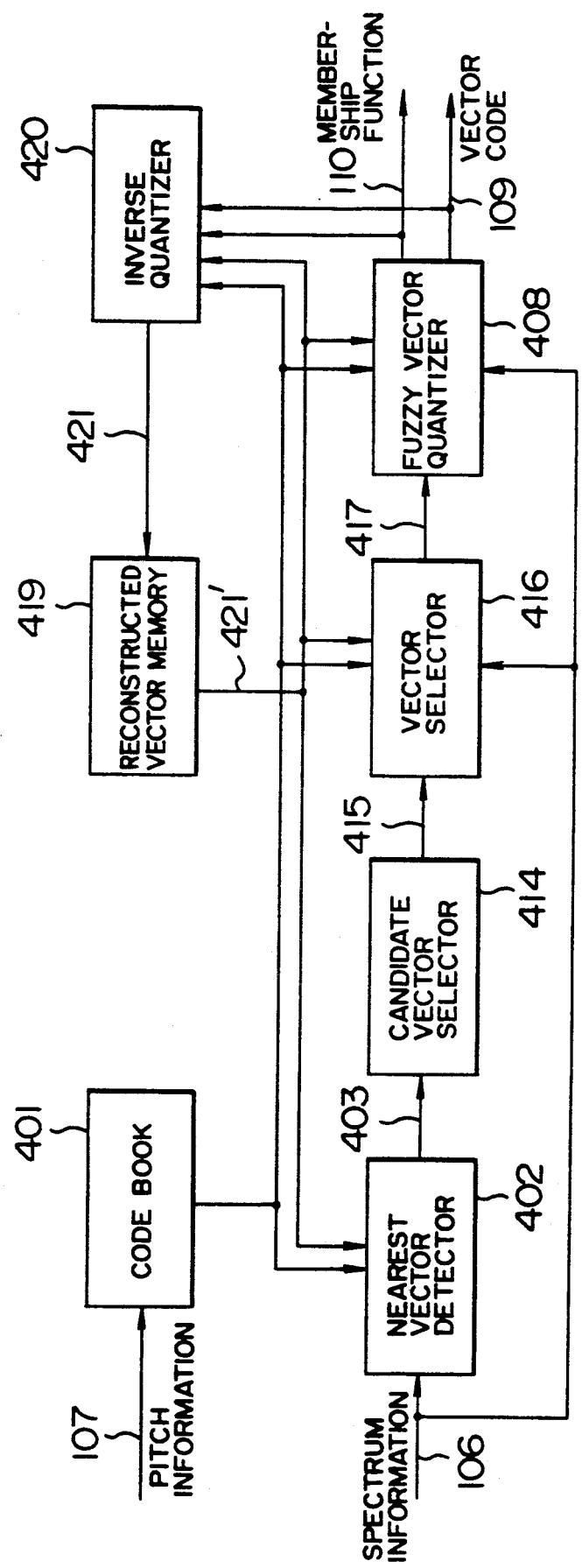
FIG. 17 is a block diagram of a fuzzy vector quantizer based on the third method of the invention.

Referring to FIG. 17, the fuzzy vector quantizer utilizing the reconstructed vector will be described.

When receiving the input vector 106 of a voice, a nearest vector detector 402 reads a reconstructed vector 421' in the preceding frame from a reconstructed vector memory 419 and individual code vectors from a code book 401 and calculates distances of the code vectors from the input vector 106 to deliver a distance value 403. The scale of the distance is set up in terms of Euclid distance in which elements of vector are weighted but other suitable types of scale may also be used. In addition, the range of code vectors subjected to distance calculation may be limited by using, for example, the pitch information 107.

A candidate vector selector 414 selects candidates of code vectors for vector evaluation to be described below The vector selector 414 looks up the distance value 403 to select a predetermined number (c) of vectors having smaller distances s delivers codes 415 of candidate vectors which are aligned orderly in accordance with the closeness to the input vector. If the reconstructed vector 421' is contained in the candidate vectors, a code of other value than that assigned to the code vectors, for example, zero is assigned to the reconstructed vector. Candidate vectors may be selected in accordance with other selection criterion than the above which prescribes a predetermined uppermost threshold of distance value or both a predetermined uppermost number and a predetermined uppermost threshold of distance value for selection. If all of the code vectors in the code book are subjected to distance calculation, the candidate vector selector can be omitted.

Since the reconstructed vector in the preceding frame is selected as candidate vector in many applications, the reconstructed vector may constantly be treated as candidate vector. Further, by treating, as candidate vectors, only one of the code vectors in the code book which has the highest similarity to the input vector and a reconstructed vector, the function of the candidate vector selector can be simplified considerably.

A vector selector 416 calculates and evaluates quantization distortions in respect of the candidate vectors in accordance with the same procedure as described for the second method.

A fuzzy vector quantizer 408 looks up a vector code 417 delivered out of the vector selector 416 and uses the selected vector to perform fuzzy vector quantization of the input vector.

The fuzzy vector quantizer delivers vector code 109 and membership function 110 which are sent to the transmitter 111 and to an inverse quantizer 420. Using the same code vector and reconstructed vector 421' as those used for quantization of the input vector 106, the inverse quantizer 420 calculates a reconstructed vector 421 for the input vector 106. Specifically, the reconstructed vector xk' 421 is calculated pursuant to equation (4) described previously. The reconstructed vector 421 is transferred to the reconstructed vector memory 419 and stored therein. Concurrently therewith, the reconstructed vector in the preceding frame is erased. Obviously, the updated reconstructed vector is identical to a reconstructed vector produced in the receiving station.

In the foregoing, the vector selection function of the present embodiment is described as applied to the conventionally proposed, ordinary fuzzy vector quantization. On the other hand, the vector selection function may also be applied to the fuzzy vector quantization based on the first method wherein vectors neighboring each code vector are registered in advance.

In this case, the candidate vectors are the nearest vector, vectors neighboring the nearest vector and registered in advance, and reconstructed vector 421'. Accordingly, the function of the candidate vector selector 414 is simplified considerably. Also, the vector code delivered out of the final stage of fuzzy vector quantizer 408 is the nearest vector code alone. Non-selected ones of the candidate vectors can be identified by making associated membership function values zero.

The receiving station will now be described.

Figure 18:
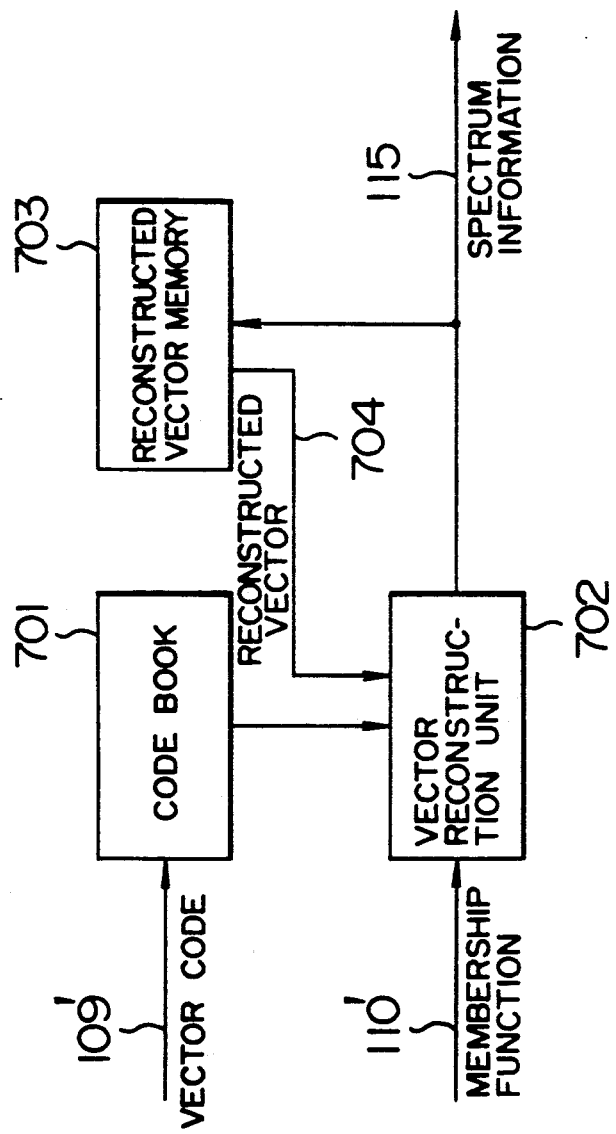
FIG. 18 is a block diagram of a fuzzy vector inverse quantizer based on the third method of the invention.

FIG. 18 is for explaining the fuzzy vector universe quantizer 114. When a vector code 109' is received by a code book 701, the corresponding code vector vi is read out of the code book 701 and at the same time the reconstructed vector 704 in the preceding frame is read out of a reconstructed vector memory 703. A vector reconstruction unit 702 responds to the readout code vector and reconstructed vector and received membership functions $\mu$lk 110' to reconstruct a vector pursuant to equation (4) described previously. The code book 701 in the receiving station has the same contents as that of the code book 401 in the transmitting station. Also, the reconstructed vector 704 is identical to the reconstructed vector 421' in the preceding frame in the transmitting station. The reconstructed vector $xk' = \{A_1', A_2', \ldots, A_m'\}$ is delivered as spectrum information 115 to the synthesizer 116.

In accordance with this embodiment, the quantization distortion can be reduced at a portion where a series of similar spectra exists, especially, at a vowel portion and a smooth, reproduced voice can be obtained. In addition, since the vector used for fuzzy vector quantization is selected, sharpness of the reproduced voice can be maintained even when the nature of the spectrum changes remarkably as in the case of the change of constant to vowel and hence a reproduced voice of high articulation can be obtained.

In a modification, two kinds of code books may be employed. More particularly, a first code book is used for the ordinary vector quantization in which a code vector merely close to an input vector is made to correspond to the input vector, and a second code book is dedicated to quantization distortion. The second code book may be used in the following manner. More particularly, when the input vector is subjected to the ordinary vector quantization by using the first code book, quantization distortions are produced which in turn are subjected to fuzzy vector quantization by using the second code book containing vectors representative of quantization distortions in parameter form. A first quantization distortion obtained after completion of the above two steps of vector quantization is compared with a second quantization distortion obtained through the fuzzy vector quantization. Thus, the quantization scheme which provides smaller one of the first and second quantization distortions is selected. For an input vector for which the quantization distortion can not be reduced efficiently through fuzzy vector quantization, the second code book dedicated to quantization distortion can be used effectively to improve quantization characteristics.

The fourth method of the invention will now be described.

The fourth method uses, in addition to the ordinary vector quantization means (code book, means for comparing the input vector with code vectors and means for selecting the nearest code vector), means for approximating the input vector by using a function of a plurality of code vectors in the code book. The function approximation means includes means for selecting a plurality of code vectors in accordance with a predetermined evaluation criterion, and means for calculating parameters of a function.

the fourth method is implemented as follows. When receiving a voice described to be transmitted, an analyzer extracts a characteristic vector from the voice. The characteristic vector is sequentially compared with code vectors in the code book to select the nearest vector. At that time, the distance between input vector and code vector corresponds to quantization distortion in the ordinary vector quantization.

Subsequently, code vectors to be combined with the nearest vector are selected. Candidates for combination vectors are registered in advance in respect of individual code vectors (usually, vectors neighboring the nearest vector). More specifically, candidate code vectors registered for the nearest vector are sequentially taken out and combined with the nearest vector to provide a linear combination which approximates the input vector. In this procedure, the coefficient of the linear combination is determined in such a manner that the highest degree of approximation can be obtained. Approximation errors (corresponding to quantization distortions) are calculated in respect of individual candidate vectors and a candidate vector having the minimum error is selected.

The coefficient of a linear combination of the nearest vector and codes of selected code vectors stands for transmission parameter. In the receiving station, the input vector is reconstructed (inverse-quantized) from the above information in the form of a linear combination of designated code vectors.

While the amount of information (the number of bits) indicative of the code of the nearest vector must amount to the number of bits corresponding to the size of the code book, the number of bits of codes of the combination code vectors which amounts to the number of bits corresponding to the number of registered candidate vectors suffices. Individual coefficients of the linear combination are subjected to scalar quantization for the purpose of transmission but the number of combination code vectors usually amounting to only one suffices. Accordingly, in accordance with the present embodiment, there is no need of transmitting the surplus amount of information and the information can be compressed greatly as compared to the prior art method.

Figure 19:
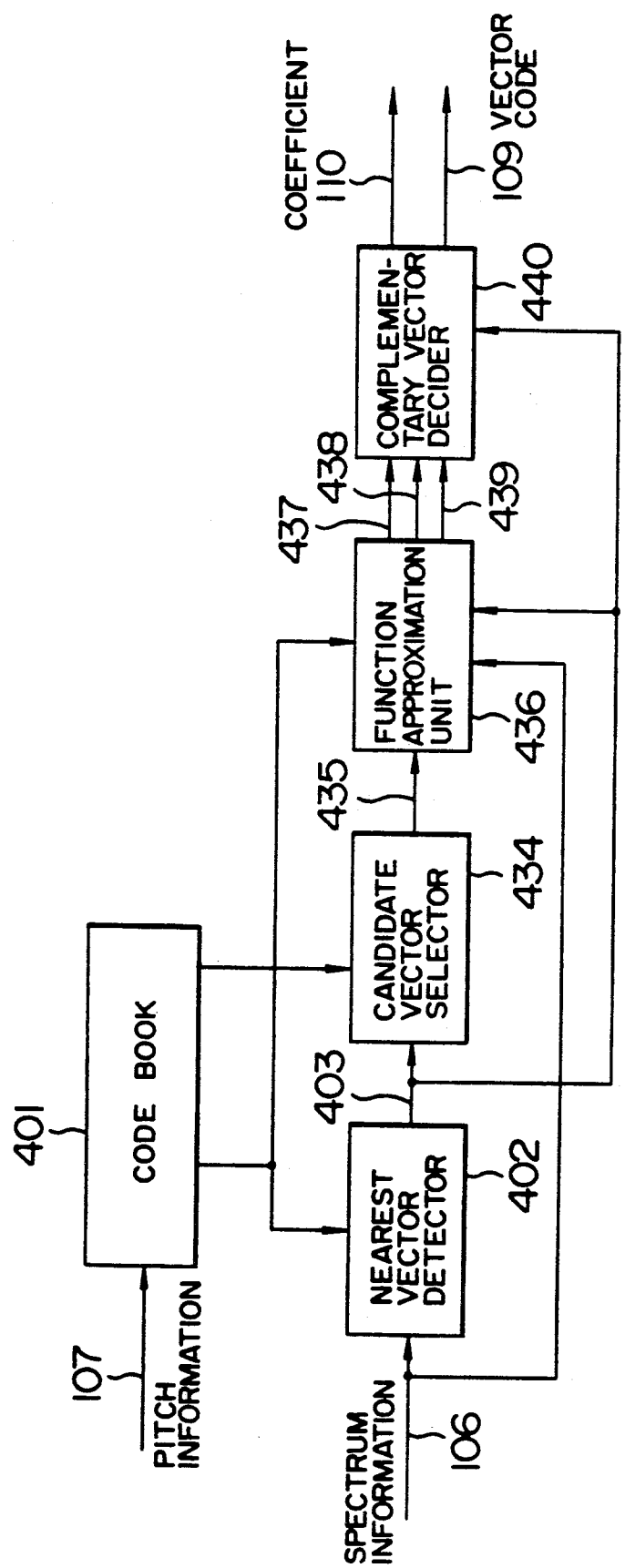
FIG. 19 is a block diagram of a fuzzy vector quantizer based on the fourth method of the invention.

FIG. 19 is for explaining the fourth method. Values of elements of code vectors and codes of the code vectors are stored in a code book 401. For the purpose of candidate vector selection to be described later, codes of vectors neighboring individual code vectors are also stored in the code book. Stored contents is the same as that shown in FIG. 6.

When receiving spectrum information (input vector) 106, a nearest vector detector 402 reads individual code vectors from the code book 401 and calculates a distance of each code vector from the input vector 106. The scale of the distance is set up in terms of Euclid distance in which elements of vector are weighted but other suitable types of scale may also be used. In case where the whole number of code vectors is searched, distances of all of the code vectors in the code book are calculated and a code 403 of a code vector having the minimum value of distance (nearest vector) is delivered. In addition, the range of code vectors to be retrieved may be limited by using, for example, the pitch information 107.

A candidate vector selector 434 selects code vectors standing for candidate code vectors (hereinafter called complementary vectors) which are combined with the nearest vector to approximate the input vector. The selector 434 responds to the code 403 of the nearest vector to read codes of neighboring vectors registered in the code book 401 and delivers candidate vector codes 35. If all of the code vectors in the code book 401 are treated as candidate vectors, the candidate vector selector is not required. In such a case, codes of all code vectors excepting the nearest vector code stand for candidate vector codes 435.

A function approximation unit 436 approximates the input vector by using a plurality of code vectors. A variety of function forms are conceivable but approximation in the form of a linear combination of two code vectors will be exemplified. On of the two code vectors is the nearest vector.

Figure 20:
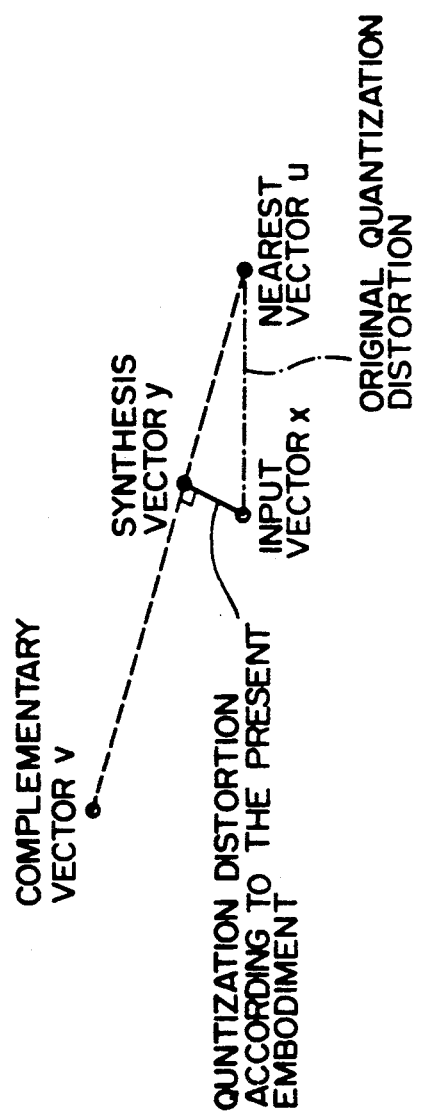
FIG. 20 is a diagram for explaining the manner of determining a synthesis vector based on the fourth method.

The principle of approximating the input vector by using the linear combination of two code vectors will be described with reference to FIG. 20. In FIG. 20, two-dimensional vectors are illustrated for simplicity of explanation.

A synthesis vector in the form of the linear combination or an approximation vector lies on a straight line connecting the nearest vector u and the complementary vector v. The synthesis vector point takes either an internal division point or an external division point of the vectors u and v depending on sign and magnitude of weight coefficients. Weights of the linear combination are so determined as to minimize the quantization distortion. As is clear from FIG. 20, the quantization distortion can be reduced by approximating the input vector in the form of the linear combination of the two code vectors.

The two code vectors may be selected from all of combinations of two code vectors but the nearest vector may be selected as one of the code vectors at high probability. Accordingly, it does not matter that the one vector is constantly treated as the nearest vector and in this manner, the quantization distortion can be reduced by the degree comparable to that for selection from all of combinations.

Where the number of code vectors involved is m, the number of combinations of any two code vectors is given by $$_mC_2 = \frac{m!}{(m-2)!2!} = \frac{m(m-1)}{2}.$$

On the other hand, with one vector fixed in advance, the number of combinations of the fixed one vector and any other vector is given by $$_{m-1}C_1 = \frac{(m-1)!}{(m-2)!1!} = m - 1.$$

indicating that the amount of processing can be reduced by the factor of a multiplier of 2/m in the former case as compared to the latter case.

In general, given that the vectors are l-dimensional vectors including an input vector represented by $x=\{x_1, x_2, \ldots, x_l\}$, a nearest vector represented by $u=\{u_1, u_2, \ldots, u_l\}$, and a complementary vector represented by $v=\{v_1, v_2, \ldots, v_l\}$, a synthesis vector is given by where w and (1−w) are $$y = wu + (1-w)v \ldots \quad (6)$$

coefficients of a linear combination and the coefficient w is so set as to minimize the approximation error $|x-y|$. The square error $Q_D^2$ is then introduced which is $$Q_D^2 = \sum_{i=1}^{l} (wv_i + (1-w)u_i - x_i)^2$$

and it is subjected to partial differentiation. By letting the results of the partial differentiation be equal to zero, the coefficient w is given by $$w = \frac{\sum_{i=1}^{l}(u_i - x_i)(u_i - v_i)}{\sum_{i=1}^{l}(v_i - u_i)^2}.$$

ps The synthesis vector point takes an internal division point for $0 \leq w \leq 1$ and an external division point for $w<0$ or $w>1$. The thus determined coefficient w minimizes the error. The linear combination in the case of two code vectors u and v is generally represented $$w_1 u + w_2 v \quad (w_1, w_2: coefficient)$$

The explanation above mentioned represents the case under the condition of $w_1 + w_2 = 1$.

In the foregoing, two code vectors are used but a combination ($w_1$, $w_2$, ---) of coefficients can also be determined in a similar manner by using three or more code vectors. If the margin of the amount of processing is large, it is not always necessary to stick to the use of the nearest vector but selection may be done from all combinations of a requisite number of code vectors. Further, in the foregoing, the code book is described as being provided by one but obviously a plurality of independent or dependent code books may be used for selection of code vectors having the highest degree of approximation.

Returning to FIG. 19, the second half of the vector quantizer will be described. The function approximation unit delivers a code 437 of the candidate vector combined with the nearest vector, a coefficient 438 minimizing the approximation error and an approximation error value (corresponding to quantization error) 439 at that time. A complementary vector decider 440 receives the output signals from the function approximation unit 436 and the code 403 of the nearest vector and delivers a vector code 109 representative of the codes of the candidate vector minimizing the approximation error and of the nearest vector and the coefficient 110 at that time.

In the foregoing embodiment, the input vector is approximated in the form of a linear combination of a plurality of vectors and the coefficient in the linear combination is so determined as to minimize the approximation error. In an alternative, the coefficient may be determined on the basis of the formula defining the membership function in the fuzzy vector quantization.

The operation of the receiving station will now be described with reference to FIG. 8.

When a vector code 109' is received, a corresponding code vector is read out of the code book 701. The vector reconstruction unit 702 responds to the read-out code vector and received coefficient or coefficient set 110' (in the case of fuzzy vector quantization, 110' represents the membership function) to reconstruct a vector pursuant to the previously-described equation (6) (in the case of fuzzy vector quantization, equation (4)). The contents of the code book 701 in the receiving station is the same as that of the code book 401 in the transmitting station. The reconstructed vector $y = \{A_1', A_2', \ldots, A_m'\}$ is sent as spectrum information 115 to the synthesizer 116.

Figure 21:
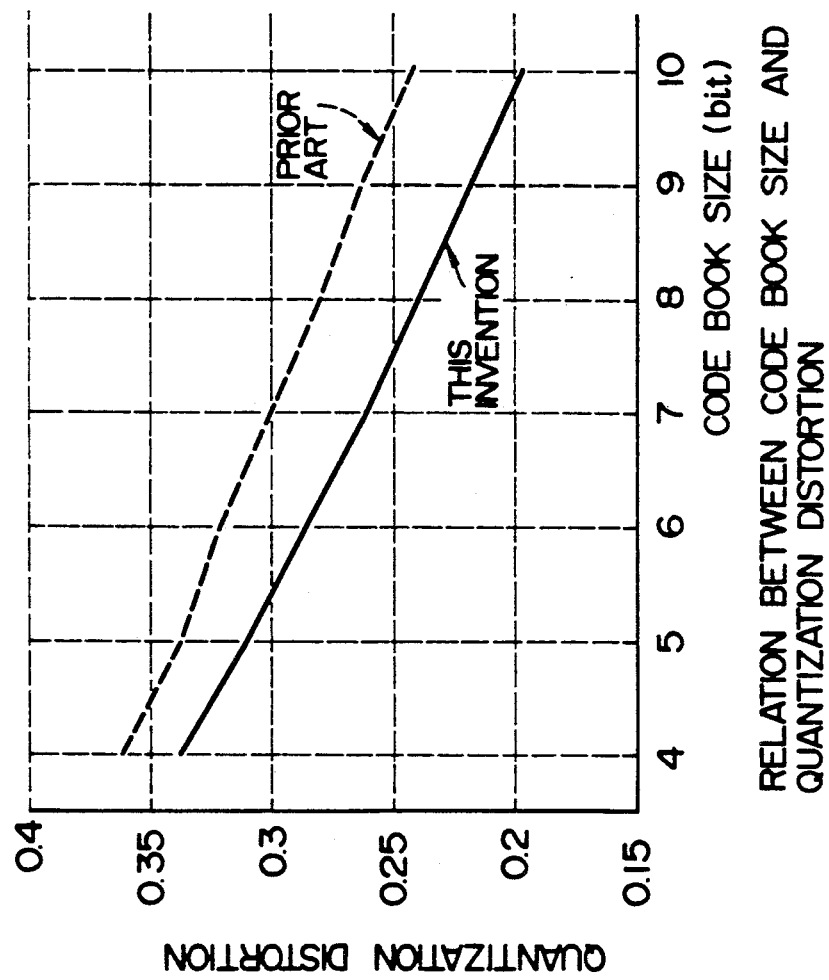
FIG. 21 is a graph showing the effect of the fourth method of the invention.

Meritorious effects of this embodiment are graphically demonstrated in FIG. 21 where the quantization distortion is plotted in relation to the code book size. For example, for a quantization distortion of 0.25, the ratio of the code book size in terms of bit number according to the present embodiment to that according to the prior art method is about ¼ to advantage.

The voice coding system based on vector quantization according to the invention may also be applied to voice mail systems, voice data multiplex systems, security protection systems, mobile radio systems, voice recognition response systems and voice processing apparatus.

We claim:

1. A system for voice coding based on vector quantization comprising:
    (a) means in which a distribution area of parameters representative of a voice is divided into a plurality of domains so that one vector (code vector) having elements represented by values of said parameters may correspond to one domain;
    (b) means for representing individual code vectors by codes specific thereto;
    (c) means for registering as neighboring vectors code vectors in a plurality of domains which are close, in terms of vector space distance, to each code vector;
    (d) means for storing said code vectors, codes and said codes of said neighboring vectors;
    (e) means for converting an input voice into a vector having elements represented by values of said parameters;
    (f) means for determining the distance between the converted input voice vector and each of said code vectors in said domains by reading out said neighboring vectors from said means for storing and calculating distances between each of said neighboring vectors and said converted input voice vector;
    (g) means for determining a code vector having a minimum value of distance to be a nearest vector and selecting a code representing said nearest vector from said stored codes for transmitting;
    (h) means for determining membership functions by numerically expressing the distance between said input voice vector and each of neighboring vectors registered in association with said selected code; and
    (i) means for transmitting, as vector quantization information, said numerically expressed membership functions and selected code.

2. A voice coding system according to claim 1 wherein said transmitting means includes:
    (a) diverse quantization means for determining a reconstructed vector from said vector quantization information through interpolation;
    (b) means for determining the difference between said reconstructed vector and said input vector; and
    (c) means for modifying said vector quantization information for said selected code such that the difference can be minimized.

3. A voice coding system according to claim 1 wherein said means for converting an input voice into a vector includes:
    (a) means for windowing a predetermined interval of the input voice signal;
    (b) means for effecting Fourier transform of a windowed signal;
    (c) means for determining a power spectrum by squaring respective components resulting from the Fourier transform performed by said means for effecting;
    (d) means for logarithmically converting the power spectrum;
    (e) means for effecting cosine expansion of said logarithmically converted power spectrum; and
    (f) means for determining said input voice vector by using coefficient values of respective components resulting from the cosine expansion as said parameter values.

4. A voice coding system according to claim 3 wherein said means for determining a power spectrum includes means for extracting harmonics of the pitch frequency from the results of the Fourier transform performed by said means for effecting.

5. A voice coding system according to claim 3 wherein said storage means includes:
  (a) means for sequentially grouping said parameter values represented by said coefficient values in respect of individual parameter values corresponding to coefficient values of a same order by which a number of said respective components resulting from the cosine expansion is represented, beginning with a parameter value corresponding to a coefficient value of lower order of said power spectrum and reaching a parameter value corresponding to a coefficient value of higher order of said power spectrum; and
  (b) means for hierarchically arranging parameter values in respective groups of respective orders.

6. A voice coding system according to claim 3 wherein said means for storing includes storage means for storing coefficient values each being of a different order as parameter values of said code vector in accordance with values of said pitch frequency.

7. A voice coding system according to claim 3 wherein said storage means includes means for limiting a range within which said storage means is retrieved, in accordance with values of pitch information.

8. A voice coding system according to claim 1 wherein said means for determining the distance includes means for weighting individual elements of each vector the distance of which is to be determined, and means for determining the distance on the basis of the weighted elements.

9. A voice coding system according to claim 8 wherein said means for determining membership functions includes:
  (a) means for determining the membership functions pursuant to $$\mu lk = \frac{1}{\sum_{j=0}^{N} \left(\frac{d_{lk}}{d_{jk}}\right)^{\frac{1}{\alpha-1}}}$$

where
  l = 0, 1, ---, N
  N+1: the number of code vectors
  $\mu lk$: membership function
  $d[i]_k$: the distance between input vector and each code vector
  $\beta$: weighting coefficient; and
  (b) means for determining values of weighing coefficients in accordance with a degree by which the weighing coefficients affect voice quality.

10. A system for voice coding based on vector quantization comprising:
  (a) means in which a distribution area of first parameters representative of a voice is divided into a plurality of domains so that one vector (first code vector) having elements represented by values of said first parameters may correspond to one domain;
  (b) means for representing individual first code vectors by first codes specific thereto;
  (c) means for registering as neighboring vectors code vectors in a plurality of domains which are close, in terms of vector space distance, to each code vector;
  (d) first storage means for storing said first code vectors, said first codes and codes of said neighboring vectors;
  (e) means for converting an input voice into a vector having elements represented by values of said first parameters;
  (f) means for determining the distance between the converted input voice vector and each of said first code vectors in said domains by reading out said neighboring vectors from said first storage means and calculating distances between each of said neighboring vectors and said converted input voice vector;
  (g) means for determining a first code vector having a minimum value of distance to be a nearest vector and selecting a first code representing said nearest vector from said stored codes;
  (h) vector inverse quantization means for determining, from said selected first code, a reconstructed vector which approximates said input voice vector;
  (i) means for determining a quantization distortion representing a difference between said input voice vector and said reconstructed vector;
  (j) means in which a distribution area of second parameters representative of said quantization distortion is divided into a plurality of domains so that one vector having elements represented by values of said second parameters may correspond to one domain;
  (k) means for representing individual second code vectors by second codes specific thereto;
  (l) means for registering as second neighboring vectors second code vectors in a plurality of domains which are close, in terms of vector space distance, to each second code vector;
  (m) second storage means for storing said second code vectors, second codes and said codes for said second neighboring vectors;
  (n) means for converting said quantization distortion into a second vector having elements represented by values of said second parameters;
  (o) means for determining the distance between the quantization distortion vector and each of said second code vectors in said domains by reading out said second neighboring vectors from said second storage means and calculating distances between each of said second neighboring vectors and said quantization distortion vector;
  (p) means for determining a second code vector having a minimum value of distance to be a nearest vector and selecting a second code representing said nearest vector from said stored second codes;
  (q) means for determining membership functions by numerically expressing the distance between said quantization distortion vector and each of second neighboring vectors registered in association with said selected second code vector; and
  (r) means for delivering, as vector quantization information for said input voice, said numerically expressed membership functions and selected second and first codes.

11. A system for voice coding based on vector quantization comprising:
  (a) means in which a distribution area of parameters representative of a voice is divided into a plurality of domains so that one vector (code vector) having elements represented by values of said parameters may correspond to one domain;
  (b) means for representing individual code vectors by codes specific thereto;
  (c) means for storing said code vectors and said codes;
  (d) means for converting an input voice into a vector having elements represented by values of said parameters;
  (e) means for retrieving said storage means to select code vectors as candidate vectors for vector quantization on the basis of distances between a plurality of said code vectors and said converted input voice vector;
  (f) means for effecting fuzzy vector quantization of said input voice vector after each time when the candidate vectors are sequentially added one by one to a candidate vector having a minimum distance;
  (g) means for comparing a quantization distortion occurring before sequential addition of candidate vectors with that occurring after said sequential addition;
  (h) means responsive to a result of a comparison to decide in accordance with an increase or decrease in said quantization distortion whether the added candidate vectors would be used for the fuzzy vector quantization;
  (i) means for selecting a code of said candidate vector having information of highest similarity;
  (j) means for determining membership functions by numerically expressing the distance between said input voice vector and each of candidate vectors used for said fuzzy vector quantization; and
  (k) means for transmitting, as vector quantization information, said numerically expressed membership functions and selected code.

12. A voice coding system according to claim 11 wherein said means for selecting candidate vectors includes:
  (a) means for determining the distance between said input voice vector and each code vector; and
  (b) means for selecting a predetermined number of code vectors in accordance with a closeness of each code vector to said input voice vector, said selecting being performed in a predetermined manner.

13. A voice coding system according to claim 11 wherein said means for selecting candidate vectors includes:
  (a) means for determining the distance between said input voice vector and each code vector; and
  (b) means for selecting code vector having values of the distance which are below a predetermined value.

14. A voice coding system according to claim 11 wherein said transmitting means includes:
  (a) inverse quantization means for determining a reconstructed vector from said vector quantization information through interpolation;
  (b) means for determining the difference between said reconstructed vector and said input vector; and
  (c) means for modifying said vector quantization information such that the difference can be minimized.

15. A voice coding system according to claim 11 wherein said transmitting means includes:
  (a) inverse quantization means for determining a reconstructed vector from said vector quantization information through interpolation;
  (b) means for storing said reconstructed vector; and
  (c) means for fetching the stored reconstructed vector as one of said code vectors.

16. A voice coding system according to claim 15 wherein said candidate vector selection means includes:
  (a) means for determining the distance between said input voice vector and each code vector; and
  (b) means for selecting a predetermined number of code vectors in accordance with a closeness of each code vector to said input voice vector, said selecting being performed in a predetermined manner.

17. A voice coding system according to claim 15 wherein said candidate vector selection means includes:
  (a) means for determining the distance between said input voice vector and each code vector; and
  (b) means for selecting code vectors having values of the distance which are below a predetermined value.

18. A voice coding system according to claim 15 wherein said transmitting means further includes:
  (a) means for determining the difference between said reconstructed vector and said input voice vector; and
  (b) means for modifying said vector quantization information such that the difference can be minimized.

19. A system for voice coding based on vector quantization comprising:
  (a) means in which a distribution area of parameters representative of a voice is divided into a plurality of domains so that one vector (code vector) having elements represented by values of said parameters may correspond to one domain;
  (b) means for representing individual code vectors by code as specific thereto;
  (c) means for registering as neighboring vector code vectors in a plurality of domains which are close, in terms of vector space distance, to each code vector;
  (d) means for storing said code vectors, codes and said codes of said neighboring vectors;
  (e) means for converting an input voice into a vector having elements represented by values of said parameters;
  (f) means for determining the distance between the converted input voice vector and each of said code vectors in said domains by reading out said neighboring vectors from said means for storing and calculating distances between each of said neighboring vectors and said converted input voice vector;
  (g) means for determining a nearest vector having a minimum value of distance;
  (h) means for selecting, from said neighboring vector registered in association with said nearest vector, candidate vectors which are combined with said nearest vector to approximate said input voice vector;

(i) means for determining a synthesis vector which approximates said input voice vector and which takes the form of a linear combination of said nearest vector and candidate vectors;

(j) means for determining a coefficient of the linear combination through weighing by which the quantization distortion is minimized; and (k) means for transmitting, as vector quantization information, said coefficient of linear combination, said candidate vectors, said codes and said code of said nearest vector.

20. A voice coding system according to claim 19 wherein said means for determining a synthesis vector includes means for determining the synthesis vector which is positioned on a straight line connecting said nearest vector and one of said candidate vectors, and said coefficient determining means determines the coefficient pursuant to $$w = \frac{\sum_{i=1}^{l}(u_i - x_i)(u_i - v_i)}{\sum_{i=1}^{l}(v_i - u_i)^2}$$

where
  w: coefficient
  input vector: $x_i = \{X_1, X_2, \ldots, x_l\}$
  nearest vector $u_i = \{u_1, u_2, \ldots, u_l\}$
  candidate vectors used for approximation $v_i = \{v_1, v_2, \ldots, v_l\}$ 21. A voice coding system according to claim 19 wherein said storage means includes:

(a) means in which a plurality of tables describing combinations of different kinds of said code vectors, codes and neighboring vectors are stored; and (b) means for retrieving, from said plurality of tables, a table which is effective for minimization of the approximation error.

22. A system for voice decoding based on vector quantization comprising:

(a) means for storing a table having code vectors, codes of said code vectors and codes of neighboring vectors registered in association with said code vectors, the contents of said table corresponding to the contents of a second table in a transmitting station; and (b) fuzzy vector inverse quantization means for determining a reconstructed vector representing an input voice through interpolation on the basis of codes of one or a plurality of received code vectors which are used for vector quantization, said determining operation being performed by use of received membership functions and said stored table, said received code vectors and said received membership functions being received by a receiver from said transmitting station.

23. A system for voice decoding based on vector quantization comprising:

(a) first storage means for storing a table having code vectors, codes of said code vector and codes of neighboring vectors registered in association with said code vectors, the contents of said table corresponding to the contents of a second table in a transmitting station;

(b) second storage means for storing a reconstructed vector representing an input voice produced through interpolation on the basis of codes of one or a plurality of received code vectors used for vector quantization, received membership functions and said stored table, said received code vectors and said received membership functions being received by a receiver from said transmitting station;

(c) means for reading a reconstructed vector resulting from reconstruction of a preceding input voice vector form said second storage means when a signal is received; and (d) fuzzy vector inverse quantization means for determining a reconstructed vector of a currently received input voice vector through interpolation on the basis of a code of received code vectors, received membership functions, said stored table and said read-out reconstructed vector, said received code vectors and said received membership functions being received by said receiver from said transmitting station.

24. A system for voice decoding based on vector quantization comprising:

(a) means for storing a table in which code vectors, codes of said code vector and said codes of neighboring vectors registered in association with said code vectors are contained which are the same as those used for vector quantization in the transmitting station; and (b) fuzzy vector inverse quantization means for determining a reconstructed vector representing an input voice pursuant to $$i = wu + (1-w)v$$

where
  w: coefficient
  y: reconstructed vector
  input vector $x_i = \{x_1, x_2, \ldots, x_l\}$
  nearest vector $u_i = \{u_1, u_2, \ldots, u_l\}$
  candidate vectors used for approximation $v_i = \{v_1, v_2, \ldots, v_l\}$
  said nearest vector $\mu_i$ has the minimum distance to said input vector $X_i$, said candidate vectors $V_i$ correspond to some of said neighboring vectors On the basis of codes of a plurality of received code vectors used for the vector quantization, a received coefficient value used for vector approximation in the form of a linear combination, said received coefficient value being received by a receiver from a transmitting station, and said stored table, said received code vectors being received by said receiver from said transmitting station.

25. A voice communication system based on vector quantization comprising:
  a voice encoding system including (a) means in which a distribution area of parameters representative of a voice is divided into a plurality of domains so that one vector (code vector) having elements represented by values of said parameters may correspond to one domain, (b) means for representing individual code vectors by codes specific thereto, (c) means for registering as neighboring vectors code vectors in a plurality of domains which are close, in terms of vector space distance, to each code vector, (d) means for storing said code vectors, codes and said codes of said neighboring vectors, (e) means for converting an input voice into a vector having elements represented by values of said parameters, (f) means for determining the distance between the converted input voice vector and each of said code vectors in said domains by reading out said neighboring vectors from said means for storing and calculating distances between each of said neighboring vectors and said converted input voice vector, (g) means for determining a code vector having a minimum value of distance to be a nearest vector and selecting a code representing said nearest vector from said stored codes for transmitting, (h) means for determining membership functions by numerically expressing the distance between said input voice vector and each of neighboring vectors registered in association with said selected code, and (i) means for transmitting, as vector quantization information, said numerically expressed membership functions and selected code; and a voice decoding system including (j) means for storing a table in which code vectors, codes of said code vectors and said codes of neighboring vectors registered in association with said code vectors, the contents of said table corresponding to the contents of a second table in a transmitting station, and (k) fuzzy vector inverse quantization means for determining a reconstructed vector representing an input voice through interpolation on the basis of codes of one or a plurality of received code vectors which are used for vector quantization, said determining operation being performed by use of received membership functions and said stored table, said received code vectors and said received membership functions being received by a receiver from said transmitting station.

26. A voice communication system based on vector quantization comprising:

a voice encoding system including (a) means in which a distribution area of first parameters representative of a voice is divided into a plurality of domains so that one vector (first code vector) having elements represented by values of said first parameters may correspond to one domain, (b) means for representing individual first code vectors by first codes specific thereto, (c) means for registering as neighboring vectors code vectors in a plurality of domains which are close, in terms of vector space distance, to each other, (d) first storage means for storing said first code vectors, said first codes and code of said neighboring vectors, (e) means for converting an input voice into a vector having elements represented by values of said first parameters, (f) means for determining the distance between the converted input voice vector and each of said first code vectors in said domains by reading out said neighboring vectors from said first storage means and calculating distances between each of said neighboring vectors and said converted input voice vector;

(g) means for determining a first code vector having a minimum value of distance to be a nearest vector and selecting a first code representing said nearest vector from said stored codes;

(h) vector inverse quantization means for determining, from said selected first code, a reconstructed vector which approximates said input voice vector, (i) means for determining a quantization distortion representing a difference between said input voice vector and said reconstructed vector, (j) means in which a distribution area of second parameters representative of said quantization distortion is divided into a plurality of domains so that one vector (second code vector) having elements represented by values of said second parameters may correspond to one domain, (k) means for representing individual second code vectors by second codes specific thereto, (l) means for registering as second neighboring vectors second code vectors in a plurality of domains which are close, in terms of vector space distance, to each second code vector, (m) second storage means for storing said second code vectors, second codes and said codes of said second neighboring vectors, (n) means for converting said quantization distortion into a second vector having elements represented by values of said second parameters, (o) means for determining the distance between the quantization distortion vector and each of said second code vectors in said domains by reading out said second neighboring vectors from said second storage means and calculating distances between each of said second neighboring vectors and said quantization distortion vector, (p) means for determining a second code vector having a minimum value of distance to be a nearest vector and selecting a second code representing said nearest vector from said stored second codes, (q) means for determining membership functions by numerically expressing the distance between said quantization distortion vector and each of second neighboring vectors registered in association with said selected second code vector, and (r) means for delivering, as vector quantization information for said input voice, said numerically expressed membership functions and selected second and first codes; and a voice decoding system including (s) means for storing a table in which code vectors, codes of said code vectors and said codes of neighboring vectors registered in association with said code vectors, the contents of said table corresponding to the contents of a second table in a transmitting station; and (t) fuzzy vector inverse quantization means for determining a reconstructed vector representing an input voice through interpolation on the basis of codes of one or a plurality of received code vectors which are used for vector quantization, said determining operation being performed by use of received membership functions and said stored table, said received code vectors and said received membership functions being received by a receiver from said transmitting station.

27. A voice communication system based on vector quantization comprising:

a voice encoding system including a voice encoding system including (a) means in which a distribution area of parameters representative of a voice is divided into a plurality of domains so that one vector (code vector) having elements represented by values of said parameters may correspond to one domain, (b) means for representing individual code vectors by codes specific thereto, (c) means for storing said code vectors and said codes, (d) means for converting an input voice into a vector having elements represented by values of said parameters, (e) means for retrieving said storage means to select code vectors as candidate vectors for vector quantization on the basis of distances between a plurality of said code vectors and said converted input voice vector, (f) means for effecting fuzzy vector quantization of said input voice vector after each time when other candidate vectors are sequentially added one by one to a candidate vector having a minimum distance, (g) means for comparing a quantization distortion occurring before sequential addition of candidate vectors with that occurring after said sequential addition, (h) means responsive to a result of a comparison to decide in accordance with an increase or decrease in said quantization distortion whether the added candidate vectors would be used for the fuzzy vector quantization, (i) means for selecting a code of said candidate vector having information of highest, similarity, (j) means for determining membership functions by numerically expressing the distance between said input voice vector and each of candidate vectors used for said fuzzy vector quantization, and (k) means for transmitting, as vector quantization information, said numerically expressed membership functions and selected code; and a voice decoding system including (l) means for storing a table in which code vectors, codes of said code vectors and said codes of neighboring vectors registered in association with said code vectors, the contents of said table corresponding to the contents of a second table in a transmitting station; and (m) fuzzy vector inverse quantization means for determining a reconstructed vector representing an input voice through interpolation on the basis of codes of one or a plurality of received code vectors which are used for vector quantization, said determining operation being performed by use of received membership functions and said stored table, said received code vectors and said received membership functions being received by a receiver from said transmitting station.

28. A voice communication system based on vector quantization comprising:

a voice encoding system including (a) means in which a distribution area of parameters representative of a voice is divided into a plurality of domains so that one vector (code vector) having elements represented by values of said parameters may correspond to one domain, (b) means for representing individual code vectors by codes specific thereto, (c) means for storing said code vectors and said codes, (d) means for converting an input voice into a vector having elements represented by values of said parameters, (e) means for retrieving said storage means to select code vectors as candidate vectors for vector quantization on the basis of distances between a plurality of said code vectors and said converted input voice vector, (f) means for effecting fuzzy vector quantization of said input voice vector after each time when other candidate vectors are sequentially added one by one to a candidate vector having a minimum distance, (g) means for comparing a quantization distortion occurring before sequential addition of candidate vectors with that occurring after said sequential addition, (h) means responsive to a result of a comparison to decide in accordance with an increase or decrease in said quantization distortion whether the added candidate vectors would be used for the fuzzy vector quantization, (i) means for selecting a code of said candidate vector having information of highest, similarity, (j) means for determining membership functions by numerically expressing the distance between said input voice vector and each of candidate vectors used for said fuzzy vector quantization, and (k) means for transmitting, as vector quantization information, said numerically expressed membership functions and selected code; and wherein said transmitting means includes (l) inverse quantization means for determining a reconstructed vector from said vector quantization information through interpolation, (m) means for determining the difference between said reconstructed vector and said input vector, and (n) means for fetching the stored reconstructed vector as one of said code vectors; and a voice decoding system including (o) first storage means for storing a table having code vectors, codes of said code vector and codes of neighboring vectors registered in association with said code vectors, the contents of said table corresponding to the contents of a second table in a transmitting station, (p) second storage means for storing a reconstructed vector representing an input voice produced through interpolation on the basis of codes of one or a plurality of received code vectors used for vector quantization, received membership functions and said stored table, said received code vectors and said received membership functions being received by a receiver from said transmitting station, (q) means for reading a reconstructed vector resulting from reconstruction of a preceding input voice vector from said second storage means when a signal is received, and (r) fuzzy vector inverse quantization means for determining a reconstructed vector of a currently received input voice vector through interpolation on the basis of a code of received code vectors, received membership functions, said stored table and said read-out reconstructed vector, said received code vector and said received membership functions being received by said receiver from said transmitting station.

29. A voice communication system based on vector quantization comprising:

a voice encoding system including (a) means in which a distribution area of parameters representative of a voice is divided in to a plurality o domains so that one vector (code vector) having elements represented by values of said parameters may correspond to one domain, (b) means for representing individual code vectors by code as specific thereto, (c) means for registering as neighboring vector code vector in a plurality of domains which are close, in terms of vector space distance, to each code vector, (d) means for storing said code vectors, codes and said codes of said neighboring vectors, (e) means for converting an input voice into a vector having elements represented by values of said parameters, (f) means for determining the distance between the converted input voice vector and each of said code vectors in said domains by retrieving and storage means, (g) means for determining a nearest vector having a minimum value of distance, (h) means for selecting, from said neighboring vector registered in association with said nearest vector, candidate vectors which are combined with said nearest vector to approximate said input voice vector, (i) means for determining a synthesis vector which approximates said input voice vector and which takes the form of a linear combination of said nearest vector and candidate vectors, (j) means for determining a coefficient of the linear combination through weighing by which the quantization distortion is minimized, and (k) means for transmitting, as vector quantization information, said coefficient of linear combination, said candidate vectors, said codes and said code of said nearest vector;

wherein said means for determining a synthesis vector includes means for determining the synthesis vector which is positioned on a straight line connecting said nearest vector and one of said candidate vectors, and said coefficient determining means determines the coefficient pursuant to $$\mu lk = \frac{1}{\sum\limits_{j=0}^{N} \left(\frac{d_{lk}}{d_{jk}}\right)^{\frac{1}{a-1}}}$$

where $l = 0, 1, \ldots, N$
$N+1$: the number of code vectors
$\|lk$: membership function
$d[i]_{jk}$: the distance between input vector and code vector
$a$: weighting coefficient; and voice decoding system including (l) means for storing a table in which code vectors, codes of said code vector and said codes of neighboring vectors registered in association with said code vectors are contained which are the same as those used for vector quantization in the transmitting station, and (m) fuzzy vector inverse quantization means for determining a reconstructed vector representing an input voice $$w = \frac{\sum\limits_{i=1}^{l} (u_i - x_i)(u_i - v_i)}{\sum\limits_{i=1}^{l} (v_i - u_i)^2}$$

where
w: coefficient
input vector $X_i = \{x_1, x_2, \ldots, x_l\}$
nearest vector $u_i = \{u_1, u_2, \ldots, u_l\}$
candidate vector used for approximation $v_1 = \{v_1, v_2, \ldots, v_l\}$;

said nearest vector $u_i$ has the minimum distance to said input vector $X_i$, said candidate vectors $V_i$ correspond to some of said neighboring vectors on the basis of codes of a plurality of received code vectors used for the vector quantization, a received coefficient value used for vector approximation in the form of a linear combination, said received coefficient value being received by a receiver from a transmitting station, and said stored table, said received code vectors being received by said receiver from said transmitting station.

30. A method for voice coding based on vector quantization comprising the steps of:

(a) dividing a distributed area of parameters representative of a voice into a plurality of domains making one vector (code vector) having elements represented by values of said parameters correspond to one domain, and storing code vectors;

(b) storing codes assigned to said code vectors;

(c) converting an input voice into a vector having elements represented by values of said parameters;

(d) determining a code vector having a minimum value of distance from said input voice vector to be a nearest vector and selecting a code representing said nearest vector from said store codes for transmitting;

(e) selecting a predetermined number of code vectors neighboring said nearest vector as candidate vectors for approximation of said input voice vector;

(f) determining membership functions by numerically expressing the distance between said input voice vector and each of said selected code vectors and the distance between said input voice vector and said nearest vector, in accordance with $$\mu lk = \frac{1}{\sum\limits_{j=0}^{N} \left(\frac{d_{lk}}{d_{jk}}\right)^{\frac{1}{a-1}}}$$

where $l = 0, 1 \ldots, N$
$\mu l k$: membership function
$d[i]_{lk}$: the distance between input vector and code vector
$a$: weighting coefficient; and (g) transmitting and numerically expressed membership functions and said selected code as vector quantization information.

31. A voice coding method according to claim 30 wherein said transmission step includes the steps of:

(a) determining a reconstructed vector representing an input voice vector for use as a feedback signal from said vector quantization information through interpolating;
(b) storing said reconstructed vector; and
(c) using said reconstructed vector produced precedently as a candidate vector.

32. A voice coding method according to claim 31 wherein said transmission step further includes the steps of:
(a) determining an error between a reconstructed vector representing a current input voice and said input voice vector representing an input voice inputted before said current input voice; and
(b) modifying said vector quantization information for said selected code such that the difference can be minimized.

33. A method for voice coding based on vector quantization comprising the steps of:
(a) devising a distribution area of parameters representative of a voice into a plurality of domains, making one vector (code vector) having elements represented by values of said parameters correspond to one domain, and storing code vectors;
(b) storing codes assigned to said code vectors;
(c) converting an input voice into a vector having elements represented by values of said parameters;
(d) determining a code vector having a minimum value of distance from said input voice vector to be a nearest vector and selecting a code representing said nearest vector from said stored codes for transmitting;
(e) selecting a predetermined number of code vector neighboring said nearest at vector as candidate vectors for approximation of said input voice vector;
(f) determining a synthesis vector which approximates said input voice vector and which takes the form of a linear combination of said nearest vector and candidate vectors;
(g) determining a coefficient of the linear combination through weighing by which the quantization distortion is minimized; and
(h) transmitting, as vector quantization information, said coefficient of linear combination, said codes of said candidate vectors and said selected code of said nearest vector.

34. A voice coding method according to claim 33 wherein said synthesis vector determining step includes determining the synthesis vector which is positioned on a straight line connecting said nearest vector and one of said candidate vectors, and said coefficient determining step includes the step of determining the coefficient pursuant to $$w = \frac{\sum_{i=1}^{l} (u_i - x_i)(u_i - v_i)}{\sum_{i=1}^{l} (v_i - u_i)^2}$$

wherein
w: coefficient
input vector $x_i = \{x_1, x_2, \ldots, x_l\}$
nearest vector $u_i = \{u_1, u_2, \ldots, u_l\}$
candidate vector used for approximation $v_i = \{v_1, v_2, \ldots, v_l\}$
said nearest vector $\mu_i$ has the minimum distance to said input vector $X_i$, said candidate vectors $V_i$ correspond to some of said neighboring vectors.

* * * * *